US006577042B2

(12) United States Patent
Lee et al.

(10) Patent No.: US 6,577,042 B2
(45) **Date of Patent: *Jun. 10, 2003**

(54) FEEDBACK CONTROL SYSTEM FOR ULTRASOUND PROBE

(75) Inventors: Weng Lee, Bellevue, WA (US); John Popow, Cary, NC (US); Phil Bell, Raleigh, NC (US); Uri Rosenschein, Kfar Daniel (IL); Richard Klein, Cary, NC (US)

(73) Assignee: Angiosonics Inc., Morrisville, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/424,174

(22) PCT Filed: May 19, 1998

(86) PCT No.: PCT/US98/10282

§ 371 (c)(1), (2), (4) Date: Feb. 14, 2000

(87) PCT Pub. No.: WO98/53508

PCT Pub. Date: Nov. 26, 1998

(65) Prior Publication Data

US 2003/0015977 A1 Jan. 23, 2003

Related U.S. Application Data

(60) Provisional application No. 60/046,938, filed on May 19, 1997.

(51) Int. Cl.[7] ................................................ H01L 41/09

(52) U.S. Cl. .................................. 310/317; 310/316.01

(58) Field of Search ............................ 310/313 R, 314, 310/316.01, 317, 319; 364/481, 484

(56) References Cited

U.S. PATENT DOCUMENTS

| | | | | | |
|---|---|---|---|---|---|
| 3,375,583 | A | | 4/1968 | Blank et al. | 310/311 |
| 3,584,327 | A | | 6/1971 | Murry | 310/311 |
| 3,941,122 | A | | 3/1976 | Jones | 128/24 A |
| 3,956,826 | A | | 5/1976 | Perdreaux, Jr. | 32/58 |
| 4,234,245 | A | * | 11/1980 | Toda et al. | 350/269 |
| 4,865,042 | A | | 9/1989 | Umemura et al. | 128/660.03 |
| 4,869,715 | A | | 9/1989 | Sherburne | 604/22 |
| 4,870,953 | A | | 10/1989 | DonMichael et al. | 128/24 A |
| 4,936,281 | A | | 6/1990 | Stasz | 128/660.03 |
| 4,954,960 | A | * | 9/1990 | Lo et al. | 364/484 |
| 4,988,334 | A | | 1/1991 | Hornlein et al. | 604/22 |
| 5,011,488 | A | | 4/1991 | Ginsburg | 606/159 |
| 5,042,461 | A | | 8/1991 | Inoue et al. | 128/24 A |
| 5,135,482 | A | | 8/1992 | Neracher | 604/22 |
| 5,156,143 | A | | 10/1992 | Bocquet et al. | 128/24 A |
| 5,209,719 | A | | 5/1993 | Baruch et al. | 604/22 |
| 5,246,016 | A | | 9/1993 | Lieber et al. | 128/898 |
| 5,269,291 | A | | 12/1993 | Carter | 128/24 A |
| 5,318,014 | A | | 6/1994 | Carter | 601/2 |
| 5,344,395 | A | | 9/1994 | Whalen et al. | 604/22 |
| 5,351,693 | A | | 10/1994 | Taimisto et al. | 128/662.06 |
| 5,362,309 | A | | 11/1994 | Carter | 604/22 |

(List continued on next page.)

*Primary Examiner*—Thomas M. Dougherty
(74) *Attorney, Agent, or Firm*—Reed Smith LLP; William M. Dippert

(57) ABSTRACT

A control system for a probe, including a transmission member, comprises a power source for supplying a constant power to a transmission member and a transducer for coupling the constant power to the transmission member and for providing a mechanical output to the transmission member at a frequency. A frequency measuring device is also provided for constantly measuring the frequency of the mechanical output of the transducer. A current monitoring device for measuring current forwarded to the transducer which monitors the current while the frequency of said mechanical output is varied until it is determined at what frequency the current is at a maximum is also provided. A method for implementing this apparatus is also provided.

15 Claims, 19 Drawing Sheets

U.S. PATENT DOCUMENTS

| | | | | |
|---|---|---|---|---|
| 5,363,853 A | | 11/1994 | Lieber et al. | 128/662.06 |
| 5,371,429 A | | 12/1994 | Manna | 310/328 |
| 5,380,273 A | | 1/1995 | Dubrul et al. | 604/22 |
| 5,394,047 A | * | 2/1995 | Scharlack et al. | 310/316 |
| 5,397,293 A | | 3/1995 | Alliger et al. | 601/2 |
| 5,405,318 A | | 4/1995 | Nita | 604/22 |
| 5,417,672 A | | 5/1995 | Nita et al. | 604/283 |
| 5,427,118 A | | 6/1995 | Nita et al. | 128/772 |
| 5,431,663 A | | 7/1995 | Carter | 606/128 |
| 5,451,220 A | | 9/1995 | Ciervo | 606/1 |
| 5,465,468 A | | 11/1995 | Manna | 29/25.35 |
| 5,474,531 A | | 12/1995 | Carter | 604/22 |
| 5,480,379 A | | 1/1996 | La Rosa | 604/22 |
| 5,486,162 A | | 1/1996 | Brumbach | 604/22 |
| 5,498,236 A | | 3/1996 | Dubrul et al. | 604/22 |
| 5,507,738 A | | 4/1996 | Ciervo | 606/1 |
| 5,527,273 A | | 6/1996 | Manna et al. | 604/22 |
| 5,540,656 A | | 7/1996 | Pflueger et al. | 604/22 |
| 5,542,915 A | | 8/1996 | Edwards et al. | 604/22 |
| 5,542,917 A | | 8/1996 | Nita et al. | 604/22 |
| 5,609,606 A | | 3/1997 | O'Boyle | 606/194 |
| 5,611,807 A | | 3/1997 | O'Boyle | 606/169 |

* cited by examiner

FIG. 5(e)-1
FIG. 5(e)
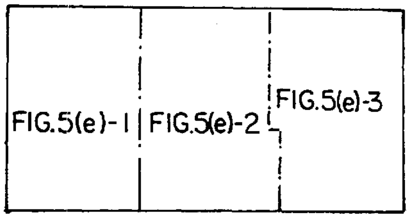
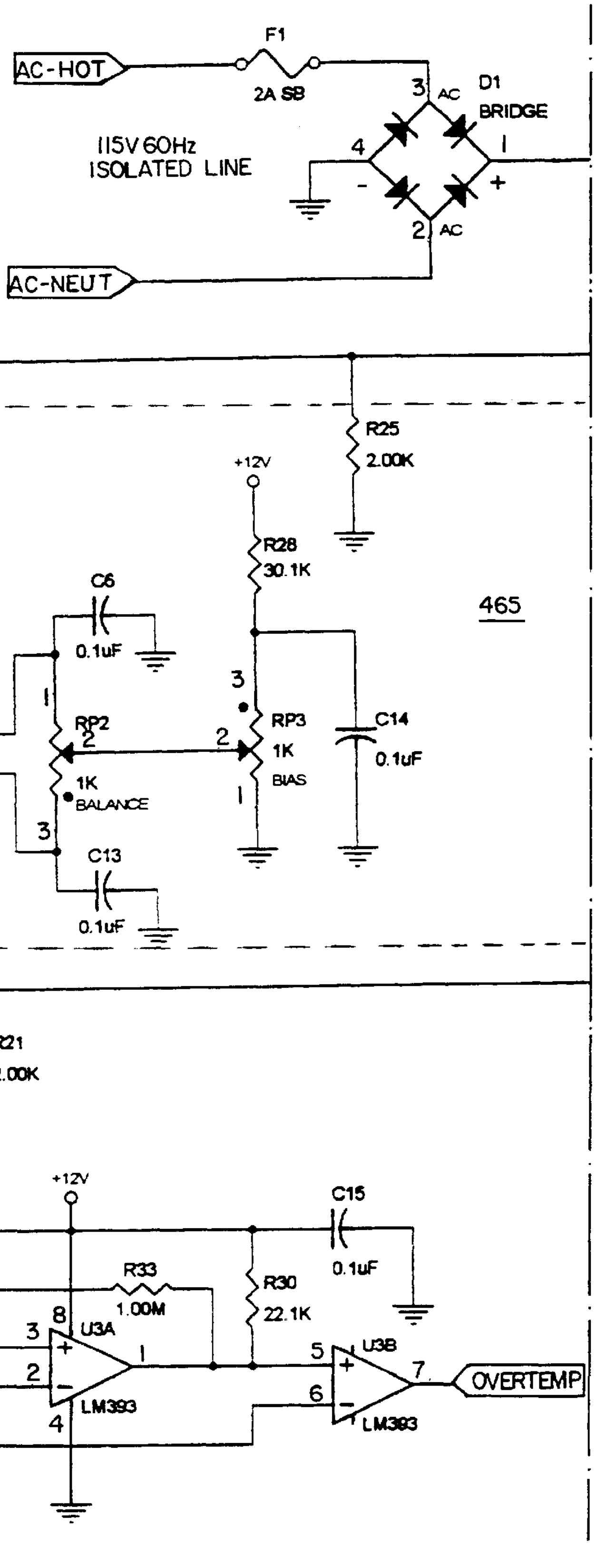

FEEDBACK CONTROL SYSTEM FOR ULTRASOUND PROBE

This application claims priority of international application No. PCT/US98/10282, which has an international filing date of May 19, 1998, now abandoned.

BACKGROUND OF THE INVENTION

This invention relates generally to medical devices and more particularly to a method and device for delivering ultrasound energy to a treatment location within a human or other mammal.

The use of ultrasound devices for lysing or removing material obstructing blood vessels in humans has been proposed in the art. These devices use ultrasound energy, either alone or with other aspects of a treatment procedure in an attempt to remove material blocking these blood vessels. One such device, an elongated ultrasound transmitting probe, has been used to lyse material obstructing blood vessels of humans or other mammals. The device consists of a cavitation generating tip at the end of an elongated transmission wire. A transducer is used to convert an electrical signal into longitudinal mechanical vibration in the transmission wire. This leads to the generation of a standing wave in the device and longitudinal displacement of the tip to transmit mechanical energy to the obstruction.

It is desirable for such an ultrasound probe to generate a wave with the maximum amplitude with a minimum of applied power. This maximum amplitude will generate the greatest lysing force and energy directed at any material being acted upon in the blood vessel. This will occur when the frequency of the ultrasound applied to the transmission wire of the probe by the transducer approaches the effective resonance frequency of the transmission wire of the probe. However, this effective resonance frequency will vary as the probe is moved within the blood vessel and among different blood vessels. Thus, the transmission wire of the probe may oscillate at less than its maximum amplitude at a given applied power. As a result, the probe will generate less than the maximum amount of ultrasonic energy within the blood vessel. The conditions which may affect the probe normally include bends in the transmission wire and compressions against the wire after the probe is fed through the various blood vessels in the body to the obstruction and moved within the blood vessel during treatment.

Additionally, conventional ultrasound probes do not measure the actual frequency or amplitude of oscillation at the probe tip. For example, space concerns generally preclude the use of features to transmit information regarding the action of the probe tip to a user. Users therefore will generally have no way to know what is actually happening at the probe tip.

One effort at maintaining suitable mechanical power transmitted by the tip is described in U.S. Pat. No. 5,477,509, the contents of which are incorporated herein by reference. This reference describes attempting to control the amplitude of the standing wave in the probe tip by monitoring the current input to the transducer, and varying the power input to the transducer so as to maintain the current input to the transducer at a constant level. Thus, when movement of the probe within the blood vessel decreases the current input to the transducer as a result of a change in the load of the transmission wire on the transducer, the power input to the transducer is increased in an effort to provide a constant power output at the tip of the probe. However, this reference fails to address the cause of the drop in supplied current. Rather the apparatus simply compensates for this decrease by inputting additional power. Thus, more power is required to be input to the transducer for the same output power which results in a decrease in the efficiency of the apparatus.

This prior art reference also describes monitoring the level of current input to the transducer to determine if there is a break in the transmission wire. If a break occurs in the transmission wire, the load of the transmission wire on the transducer will greatly decrease. This results in an extreme decrease in the required power input to achieve the supposed required power output at the tip of the probe. This change signals a problem, and the apparatus is shut down. However, such a system will not detect a problem in the transmission wire, such as a fracture, which might increase the load on the transducer. A fracture might increase the friction between the transmission wire and any other portion of the probe, for example, or any object the probe tip might come into contact with. While this fracture might be dangerous to the user, the required power input would not decrease below a predetermined level, and therefore would not be recognized as an event which would turn off the probe.

The optimal operating frequency of an ultrasonic device varies with the tolerances of the components of the device and the field of operation. In prior art ultrasonic devices, the optimal operating frequency is determined by scanning across the entire operating range of the device and locating the frequency which maximizes a particular operating parameter of the device, e.g. current. A significant drawback associated with the prior art approach of scanning across an entire operating frequency range is that a false optimum frequency may be selected which would result in sub-optimum performance for the device.

Accordingly, it would be beneficial to provide an ultrasound transmission device which can generate a maximum tip oscillation amplitude under a number of adverse conditions, and provide the feedback necessary to maintain maximum amplitude without increasing the power consumption of the apparatus, and which can monitor the system to notify the user of any fracture in the probe wire or other problem affecting the system.

SUMMARY OF THE INVENTION

Generally speaking, in accordance with the invention, an ultrasound transmission apparatus in the form of a transmission member connectable to a transducer at its proximal end and having a tip at its distal end is provided. The apparatus includes an improved control system which can control the amplitude of oscillation at the tip of the probe. This control system comprises an electric power source which supplies constant power at a selected frequency to the transducer which converts the electrical energy to mechanical oscillation and generates a standing wave in the transmission member. The control system also includes a frequency measuring and adjusting instrument for continuously measuring the frequency of the mechanical oscillations output from the transducer. This frequency measuring instrument is also capable of varying the frequency of the oscillations of the transmission member and tip by fine tuning the frequency of the oscillations generated by the transducer. Finally, current and voltage monitoring instruments are also included for measuring current and voltage to determine power input to the transducer.

The control system maintains constant power (voltage times current) to the transducer and monitors the current and voltage input to the transducer. The oscillation frequency is varied over a predetermined range in order to maintain a frequency at which current input to the transducer, and thus power, is at a maximum. The resistance along the transmission member during oscillation is proportional to the load on the transducer and therefore electrical resistance at the transducer is proportional to the load on the transducer. Because power is maintained at a constant level, the load on the transducer will be at a minimum at maximum current. The amplitude of the oscillations of the transmission wire will also be at a maximum. Thus, as the frequency of the transducer is constantly adjusted to generate the greatest input current and thus maintain power at its maximum, the apparatus will always optimize the amplitude of the oscillation of the tip thereof at a given power.

This maximum will occur when the transducer vibrates at the effective resonance frequency of the transmission member. As the probe is moved within blood vessels in various parts of the body, the resonance frequency of the probe is slightly altered. By fine tuning the frequency of the oscillation frequency of the transducer, it is possible to oscillate the transmission member at a frequency approaching this new resonance frequency. Therefore, by measuring the input current and voltage to the transducer coupled to the transmission member while fine tuning the oscillation frequency, it is possible to continuously operate the probe at close to the resonance frequency and thus at its maximum power. This will generate the maximum oscillation amplitude at the tip of the transmission member, and insure that the probe is being operated under the predetermined conditions.

Additionally, the invention includes a method for operating an ultrasound transmission device, including the steps of supplying constant electrical power to a transducer of the device and converting this electrical energy to mechanical energy in the form of an oscillating tip thereof. The frequency of oscillation of the transducer is varied over a predetermined range while the current and voltage supplied to the transducer is monitored and the power supplied to the transducer is maintained at a constant maximum level. Then, the value of the frequency which results in the maximum current, and thus power being supplied to the transducer is determined. It is at this frequency, which approaches the resonance frequency of the transmission member, that the resistance to oscillation, and thus impedance of the transducer is at a minimum, and therefore the amplitude of oscillation is at its maximum. By constantly adjusting the frequency of the transducer, and constantly monitoring for any variation in the current input and voltage to the transducer, it is possible to maintain oscillations at the tip of the transmission member at the appropriate amplitude, to insure appropriate ultrasound application to the obstruction.

In an additional embodiment of the invention, an apparatus for monitoring the amplitude, and therefore the ultrasonic energy output by an ultrasound probe, is provided. The apparatus comprises an integrator, which receives a standard voltage input and a feedback signal indicative of the power at the tip of the probe. This voltage signal is then fed into a differential amplifier. This differential amplifier receives input from the integrator, and a feedback error signal, and generates a differential signal which has a compensated value to maintain an accurate frequency signal. This differential signal is then fed to a VCO phase comparator, which compares the frequency of the output signal to the frequency of a reference signal. This reference signal is formed of a first component which defines a predetermined, center frequency of oscillation, and a second component which is a correction based upon the current state of the system, and whether it is necessary to increase or decrease the output frequency. This frequency is then divided by two to yield the adjusted output frequency, because the frequency had previously been maintained at double the required frequency to maintain a higher degree of resolution during measurement and calculation.

This adjusted output frequency signal, which is set to the required frequency, is passed through any number of power amplifiers so that the output signal is always maintained at a constant predetermined power level regardless of the frequency or other factors. This power output is then fed into an additional amplifier which outputs the power to a transducer, which in turn converts this electric power to a mechanical displacement. At the same time, the voltage and current input to the transducer is monitored, and the impedance is determined. These measured values of voltage and current, and the determined value of impedance are fed to a multiplier/filter, which processes the signal to determine the true power output at the transducer, which is also a function of the amplitude of the oscillating tip of the probe. This power determination is then fed back into the integrator where it is processed, and the feedback control loop is completed.

Thus through the use of such an apparatus, it is possible to determine whether the selected oscillation amplitude, and therefore, the selected ultrasonic power is being generated at the tip of an ultrasound probe. It is possible to maximize this power output by fine tuning the frequency of the oscillations within a predetermined range, and monitoring the transducer input current and voltage. The transducer output frequency which generates the greatest current, which takes place at a frequency approaching the resonance frequency of the transmission member in the blood vessel, will also generate the greatest amplitude of oscillation and therefore power output at the probe tip, without adjusting the input power to the transducer. Therefore, the output power from a probe can be safely controlled to within a selected range without expending excess power, and without sacrificing the efficiency of the apparatus.

Accordingly, it is an object of the invention to provide an improved control system for an ultrasound transmission probe.

Another object of the invention is to provide an improved control system and method for an ultrasound probe in which the power efficiency of the probe can be maximized.

Yet another object of the invention is to provide an ultrasound probe which provide a constant output power.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combinations of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 5(*a*), 5(*a*)-1 to 5(*a*)-3, 5(*b*), 5(*b*)-1 to 5(*b*)-3, 5*c*, 5*c*(1) to 5*c*(2), 5*d*, 5(*d*)-1 to 5(*d*)-3, 5(*e*) and 5(*e*)-1 to 5(*e*)-3 are wiring diagrams depicting the structure of a control system constructed in accordance with an embodiment of the invention.

DETAILED DESCRIPTION OF THE PREFERRED EMBODIMENTS

It has been determined that an effective way of lysing thrombus, occlusions and the like, is to use an ultrasound probe to deliver ultrasound energy to a selected area within a patient's vasculature. However, in order to reach relatively inaccessible areas of the vasculature, it is necessary to provide a narrow and flexible device which is adequately long and sufficiently guideable.

Figure 1:
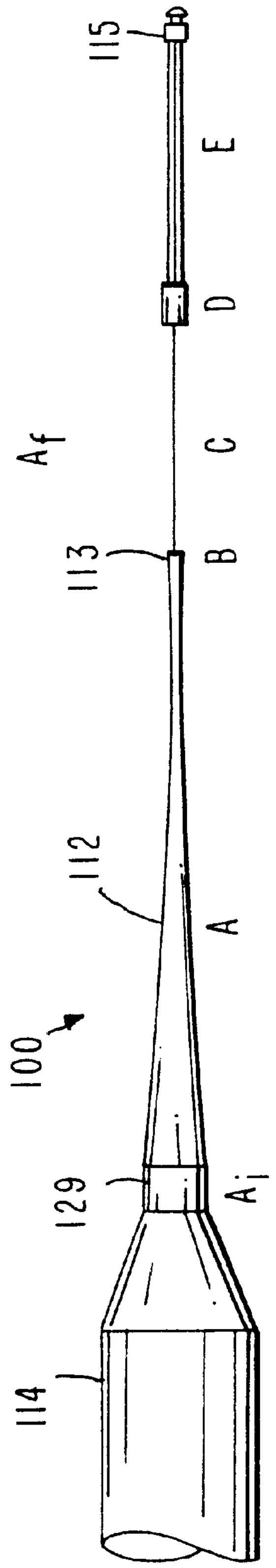
FIG. 1 is a side elevational view of an ultrasound probe, transducer and control unit constructed in accordance with an embodiment of the invention.

An improved ultrasound probe constructed in accordance with an embodiment of the invention for accomplishing the foregoing is illustrated generally as probe 100 in FIG. 1 hereof and in a copending application entitled ULTRASOUND TRANSMISSION APPARATUS AND METHOD OF USING SAME under application Ser. No. 08/858,247, filed May 19, 1997, the contents of which are incorporated herein by reference. Probe 100 is formed with a tapered member 112, formed with a proximal end 129 of diameter $A_i$ coupled to a transducer 114, which acts as a source of ultrasound energy. When coupled to transducer 114, proximal end 129 is preferably located at a displacement maximum relative to the standing ultrasound wave supported by the overall device. From proximal end 129, tapered member 112 tapers, in section A thereof, to a reduced diameter distal end 113, of diameter $A_f$ at a transition zone B. Proximal end 129 must be large enough to receive sufficient energy to treat the thrombus, occlusions and the like. However, in order to provide optimal flexibility, it is desirable to reduce the diameter of distal portions of probe 100 as much as possible, without significant loss of energy, strength or guidability. Furthermore, the reduction in diameter must be accomplished in such a manner as to amplify, i.e., increase the amplitude of, the ultrasound vibrations.

Following tapered section A of distal diameter $A_f$ (or one or more tapered sections A), is a constant diameter section C, of diameter $C_i$, where $C_i<A_f$. In the event additional reductions in diameter are desired, a second transition zone D can be provided, for coupling section C to a section E of one or more lengths of transmission media, each of diameter $E_i$, where $E_i<C_i$. Each of these sections A through E comprise a transmission member for delivery of ultrasound energy to selected locations within the vasculature and otherwise. It should also be understood that transmission members having constructions different than that of device 100, including unitary transmission members and otherwise can also be employed with the control system and method of the invention.

Section C may be composed of a different material than Section A. For example, Section A may be composed of aluminum formed as a wire or rod or other appropriate structure which has superior ultrasound transmission properties, is easily machined and is inexpensive, and Section C may be composed of titanium, titanium alloys or other materials that have adequate ultrasound transmission properties and greater strength for the same diameter.

In accordance with preferred embodiments of the invention, Section A, if it includes a taper, preferably has a tapered length which is equal to an integral multiple of half wavelengths of the intended frequency of operation. At the terminus of Section A, there may be a transition zone B, which is a step transition, wherein Section C has diameter $C_i<A_f$. To effect maximum displacement amplification, step-transition zone B should be placed at or near a displacement node (i.e., a displacement minimum). Thus, if Section A includes a tapered section which is an integral multiple of half wavelengths, it should be followed by a straight section of length equal to an odd multiple (i.e. 1, 3, 5 . . . ) of quarter-wavelengths. In this way, Section A begins, at the proximal end 129 at a displacement maximum, and ends at its distal end 113 at a displacement minimum (displacement node). If Section A is straight (i.e. constant diameter), then it should begin at a displacement maximum and terminate at a displacement node.

Device 100 also includes a mass or cavitation tip 115 at the distal tip thereof Cavitation tip 115 is designed and shaped to distribute ultrasound energy and/or perform work in accordance with the application of interest. As a standing wave is generated in device 100, tip 115 will oscillate longitudinally and transmit ultrasound energy. The larger the amplitude of oscillation at a particular frequency, the greater the power output.

Ultrasound device 100 (as well as other probes formed with a structure similar thereto) is understood to operate in the resonance frequency mode; i.e., it supports a standing wave (preferably a longitudinal wave) when energized by ultrasound stimulation at proximal end 129. Consequently, it is preferred that cavitation tip 115 is located at a displacement maximum (anti-node). Transition zone D may be located at a displacement node or anti-node. For example, transition zone D may involve a joint that couples several parallel lengths of transmission media, of diameter $E_i$, to section C. In that case, it may be determined that the mechanical strength of transition zone D is insufficient to support maximum stress. For such a case, transition zone D may be located at or near a displacement maximum (stress minimum).

It is understood that the techniques for controlling the probe and assembling the sections thereof are equally applicable to systems that promote or focus ultrasound energy to enhance the absorption of drugs, reduce apoptosis in cells, and/or treat tissue, tumors, obstructions, and the like, within and without the body, systems to be utilized in for laproscopic surgery, and ultrasonic scalpels, for example.

During the use of an ultrasound probe in accordance with the invention, the ultrasound energy can be generated by the linear oscillation of a tip of a transmission member, such as a wire, at a particular frequency and amplitude. When this amplitude is at a maximum, for a predetermined oscillation frequency, the ultrasonic output power generated by this oscillation is also at a maximum. Therefore, an objective of efficient, safe operation is that an ultrasound probe is always operated close to this maximum amplitude. In a preferred embodiment, this oscillation maximum at the tip of the probe is within a range of 20 to 150 microns, more preferably between 20 and 100 microns, and most preferably approximately 40 microns.

It has been determined that when an ultrasound probe is fed through blood vessels or other objects, the required bends and turns of the probe and other reasons associated with the geometry required by the probe when passing through the blood vessel of a human or other body, the resistance and load of the transmission member on the transducer increases. When operated, the transmission member is oscillated in a standing wave. A standing wave includes standing nodes and anti-nodes. The oscillation amplitude is the greatest at the anti-nodes, while there is little or no displacement at the nodes. As the probe is moved within a blood vessel, pressure from different directions on the probe and other environmental changes, affect the resonance frequency of the transmission member. Thus, when constructing a probe in accordance with the invention, it is advantageous to construct an environment similar to the environment which will be encountered during use in order to select the desired range of driving frequencies.

By adjusting the frequency of the ultrasound output from the transducer, within a predetermined range, it is possible to approach the effective resonance frequency of oscillation of the transmission member so that it coincides with the resonance frequency of the member in the current position and shape. Thus, by being able to adjust this oscillation frequency, when the output amplitude, or output power is decreased because of movement of the probe within the body, rather than increasing the input power to compensate for this reduction in output power, the frequency can be varied slightly until the maximum power output is achieved. This will occur when the actual frequency of oscillation is equal to the effective resonance frequency of the probe. Thus rather than simply applying extra power to compensate for power loss in the system, which could overload the system, as has been done in the prior art, the invention attempts to address the source of the decreased power output, (in this case, oscillation of the probe wire at other than the resonance frequency) thereby improving power output without increasing power input, and also reducing the risk of damage to the blood vessel in which the probe is situated, the probe itself or otherwise.

As is noted above, however, it is difficult to directly measure the actual oscillation amplitude at the tip of a probe. Therefore, a system in accordance with the invention can utilize an alternative measurement, which is representative of the oscillation amplitude, and therefore ultrasonic power output, at the tip of the probe. By utilizing three well known formulae in which V is voltage, I is current, and Z is impedance:

(1) Power=VI (2) V=IZ it follows that (3) Power=$I^2Z$.

Therefore, if power is kept constant, any increase in the resistance, measured as an increased impedance will result in a decrease (non-linear) in the current supply. Any events which affect the resonance frequency of the transmission member and increase the difference between the resonance frequency thereof and the actual oscillation frequency of the transducer will effectively increase the resistance to mechanical oscillation of the transmission member. This results in increased electrical impedance at the transducer. Consequently, because R (resistance) and Z (impedance) are inversely proportional to I (current), any event which will adversely affect the amplitude of the mechanical oscillations of the transmission member can be detected by an accompanying decrease in the current flow to the transducer. Thus, as the difference between the resonance frequency of the transmission member and the actual oscillation frequency of the transducer (as a result of a change in the resonance frequency), the current flow to the probe will decrease.

Figure 2:
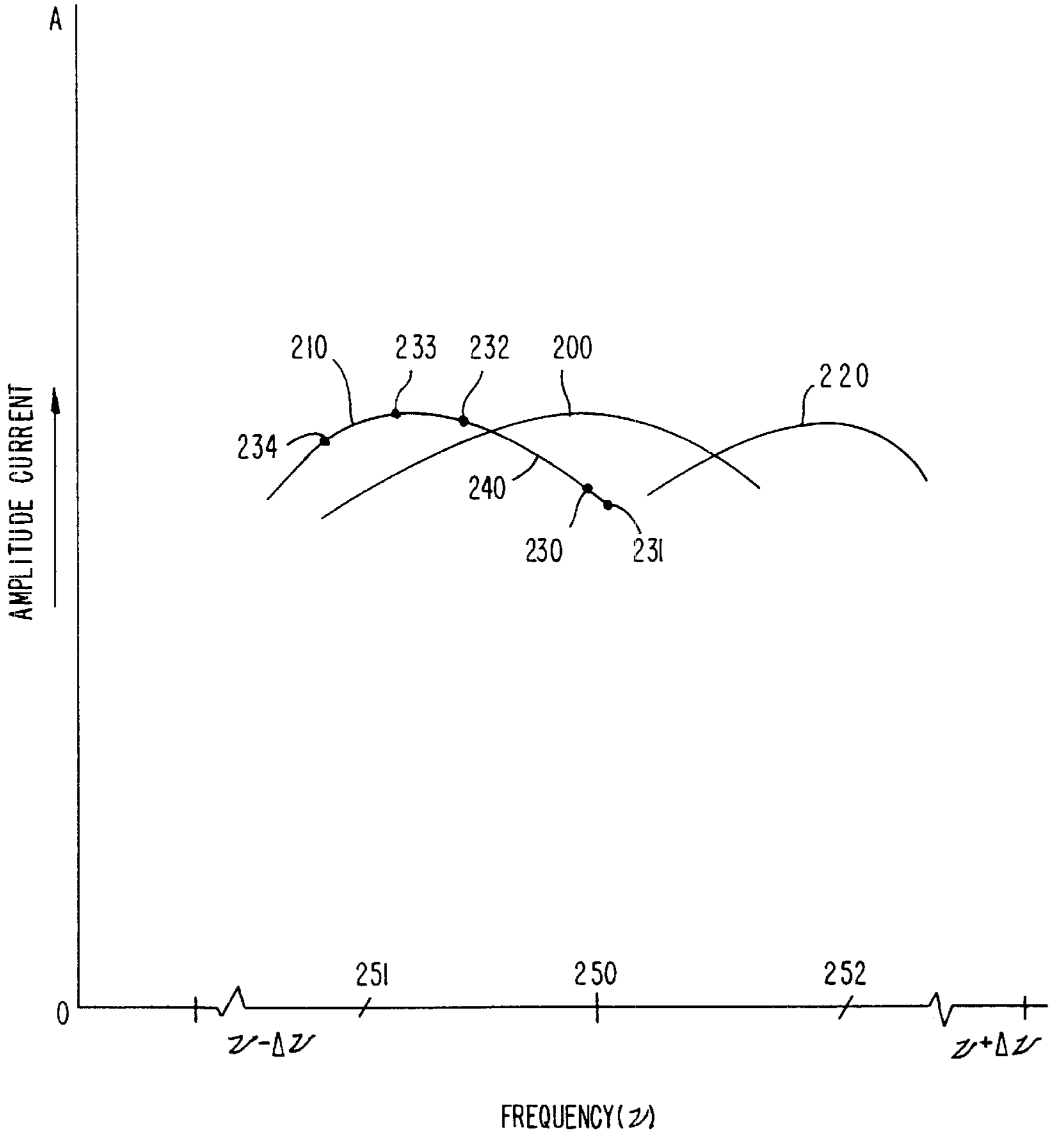
FIG. 2 is a graph depicting three of theoretical amplitude curves as a function of transducer output frequency, for the same probe at different locations in a blood vessel.

Such a situation is depicted in FIG. 2, which shows amplitude of oscillation on the Y-axis as a function of frequency of the transducer on the X-axis. Curve 200 is formed with a maximum at approximately the middle thereof, and minim at each end thereof. Thus, for curve 200, frequency 250 results in a maximum amplitude. Frequency 250 is the resonance frequency for the probe at one location. Curve 200 represents the frequency/amplitude response curve for an idealized positioning of a probe within a blood vessel in a body. In a preferred embodiment this results in an optimum frequency of approximately 42 kHz. As the probe is moved within the blood vessel, the frequency/amplitude response curve shifts. Therefore, curve 200 can shift to the values of curve 210 if the action performed on the probe reduces the resonance frequency to frequency 251, or curve 200 can shift to the values of curve 220, if the action performed on the probe increases the resonance frequency of the transmission member to frequency 252. It is to be understood that the locations of curves 200, 210 and 220 are only used as examples, and that frequency/amplitude response curves exist for each resonance frequency of oscillation of the transmission member.

Thus, after movement of the probe, and an accompanying shift in the frequency/amplitude response curve, the actual frequency of the oscillation of the transmission member will no longer be at the resonance frequency. Therefore, the amplitude of oscillation will no longer be at a maximum. As is shown in FIG. 2, if the frequency response curve is shifted from curve 200 to curve 210, whereas oscillation frequency 250 corresponds to the maximum current and amplitude of curve 200, it is now at lower arm 240 of curve 210, at a location less than the maximum current and amplitude. Therefore, if the oscillation frequency from the transducer were decreased, it would be possible to approach the resonance frequency of the transmission member, and thereby move to a position 233 corresponding to the maximum current and amplitude of the new curve.

Figure 3:
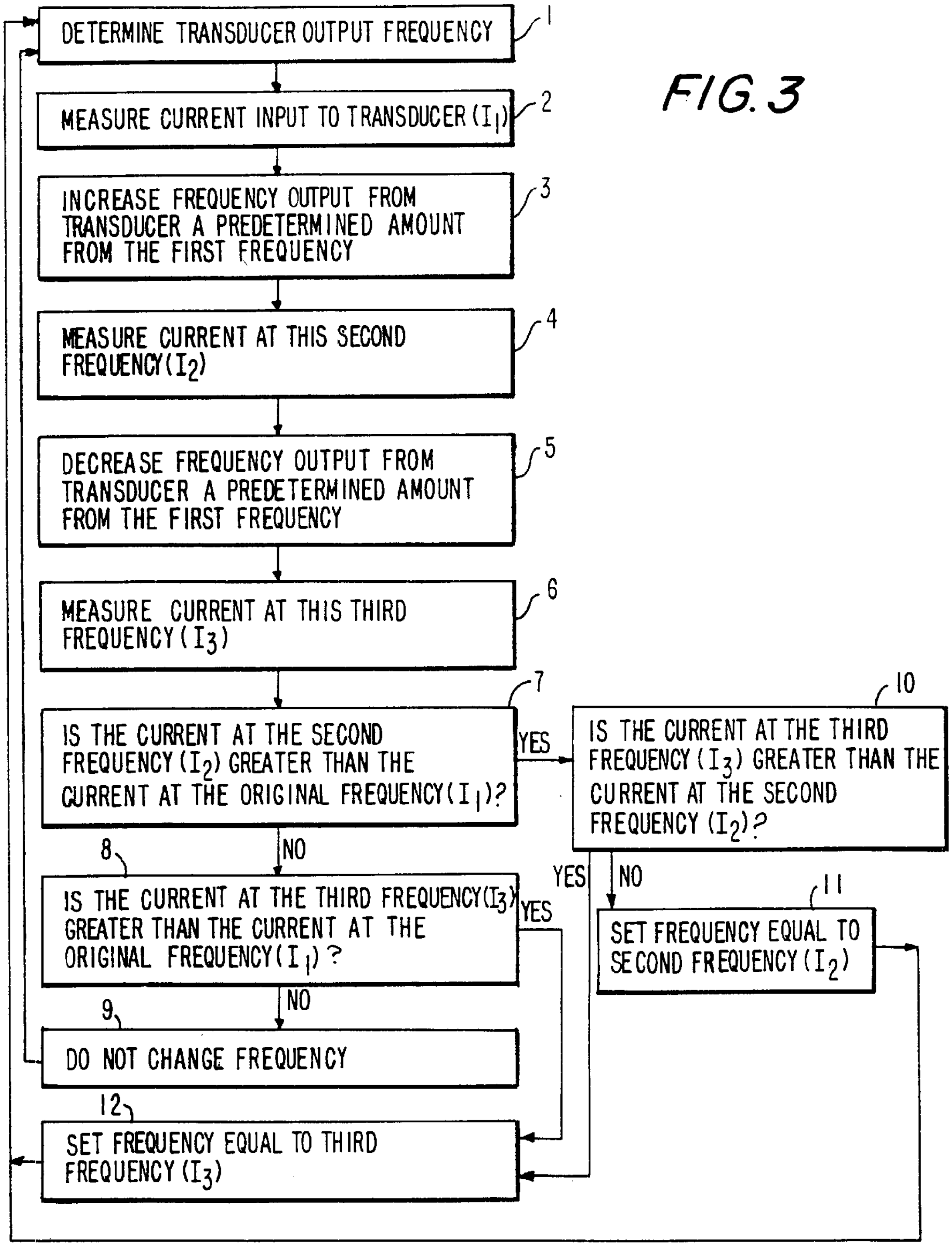
FIG. 3 is a functional block diagram illustrating the procedure utilized in operating and controlling an ultrasonic probe in accordance with an embodiment of the invention.

In order to adjust the frequency, the steps as set forth in FIG. 3 may be followed. First, in step 1, the oscillation frequency output from the transducer is determined. Next, in step 2, the current level input to the transducer for this particular frequency of oscillation is measured ($I_1$). These two characteristics form the base line information of the current system. Then in step 3, the frequency of oscillation of the transducer is increased a predetermined amount (to the right in FIG. 2) and the current at this second frequency ($I_2$) is measured in step 4. In a preferred embodiment, this predetermined frequency change is 75 Hz. Then, similarly in step 5, the frequency of oscillation of the transducer is decreased a predetermined amount, (to the left in FIG. 2) and the current at this third frequency ($I_3$) is measured in step 6. In a preferred embodiment, this predetermined frequency change is 75 Hz. In step 7, the current measured at the second frequency ($I_2$) is compared to the original current ($I_1$). If the current measured at the second frequency is less than at the original frequency ($I_2<I_1$), then the process moves to step 8 where the current at the third measured frequency ($I_3$) is compared to the current at the original frequency ($I_1$). If this current at the third frequency is also less than the original frequency ($I_3<I_1$), then since both increasing and decreasing the frequency correspond to a decrease in the current, the current is already at the maximum. Therefore in step 9, since the amplitude will also be at a maximum, the frequency is not changed. Then, the procedure returns to step 1 for measurement of the frequency again at the next sampling time.

If, however, at step 8, the current at the third frequency had been greater than at the original frequency ($I_3>I_1$), then in step 12, the new frequency is set to the third frequency, and control shifts back to step 1.

If at step 7, it is determined that the current measured at the second frequency is greater than at the first frequency ($I_2<I_1$), then control passes to step 10. In step 10, if the current at the third frequency is not greater than the current at the second frequency ($I_3<I_2$), then at step 11, the new frequency is set to the second frequency. If the current at the third frequency is greater than the current at the second frequency ($I_3>I_2$), then in step 12 the new frequency is set to the third frequency. After these steps, control is returned to step 1.

It is possible to perform this sampling routine at any selected time interval. The more frequently the values are sampled, the more accurate control of the probe will be. In a preferred embodiment of the invention, sampling is performed within a range of approximately more than every 50 milliseconds, preferably more than every 25 milliseconds, and most preferably approximately every 13 milliseconds.

In the example as depicted in FIG. 2, if the resonance frequency were to decrease to frequency 251, the frequency/amplitude curve would shift locations from curve 200 to curve 210. The frequency and amplitude would meet at point 230, below the maximum amplitude 233 for the frequency/amplitude curve 210, and also below the maximum current for the frequency/amplitude curve, and not at the new resonance frequency 251 of the transmission member. Following through the steps in FIG. 3, the current at a frequency higher than point 230 would be measured, and the current at a frequency at a point lower than point 230 would be measured. It would be determined that the current at the frequency below point 230 would be greater, and the frequency would be lowered. This process would continue until the frequency reached point 232, 233. At point 233, neither the second nor the third frequency would produce a current greater than that at point 233. Thus, the frequency would not change since the current at that frequency would be at a maximum. If the frequency were at point 234 on curve 210, the same procedure would be followed, only during each iteration, it would be determined that the frequency should be increased to increase the current, and therefore the amplitude.

If the frequency increases or decreases are chosen to be large enough, it is possible that the frequency changes will pass from over the frequency corresponding to the maximum current and amplitude from one side of curve 210 to the other, without stopping at the maximum. In a preferred embodiment, the frequency changes are approximately 150 Hz, more preferably 100 Hz, and most preferably 75 Hz, although other values can be used, based upon the geometry and other characteristics of the system. In this case, the algorithm will simply change the frequency in the other direction to obtain a substantially maximum current and amplitude. In a preferred embodiment, when two consecutive measurements indicate that the frequency should be changed in two different directions, it can be determined that the frequency corresponding to the maximum current and amplitude has been passed by. Thus, it is possible to take an average of these last two measured frequencies to determine the approximate optimal frequency. Alternatively, it would be possible to reduce the size of the current increase or decrease at each step to focus in on the maximum current. Thus, by using larger current changes at first, and then using small changes when the current is close to the maximum, the maximum is reached more quickly, and more accurately.

Under the process described above in which the full operating frequency of the probe is sampled, the time required to determine the optimal probe operating frequency and whether a power mismatch exists can be approximately 25 seconds. It is desirable to reduce this time as much as possible so that performance and system safety is improved and to ensure that a broken probe is not damaged further. Accordingly, in an alternative embodiment, the full operating frequency range of the probe is divided into a minimum of three frequency subranges with each frequency subrange having a center frequency. The center frequencies for each subrange are selected based on an analysis of the tolerances of the probe, transducer and control unit and the field of operation of the probe, all of which affect the location of the center frequencies and how they are maintained.

It has been found that in a coronary probe, the preferred first frequency subrange has a first center frequency of approximately 41.6 kilohertz, the preferred second frequency subrange has a second center frequency of approximately 41.9 kilohertz, and preferred the third frequency subrange has a third center frequency of approximately 41.3 kilohertz. It is been found that by sampling for the optimal probe operating frequency successively within these three frequency subranges, the optimal probe operating frequency and the presence of a power mismatch can be determined more quickly, often within 15 to 20 seconds.

Figure 6:
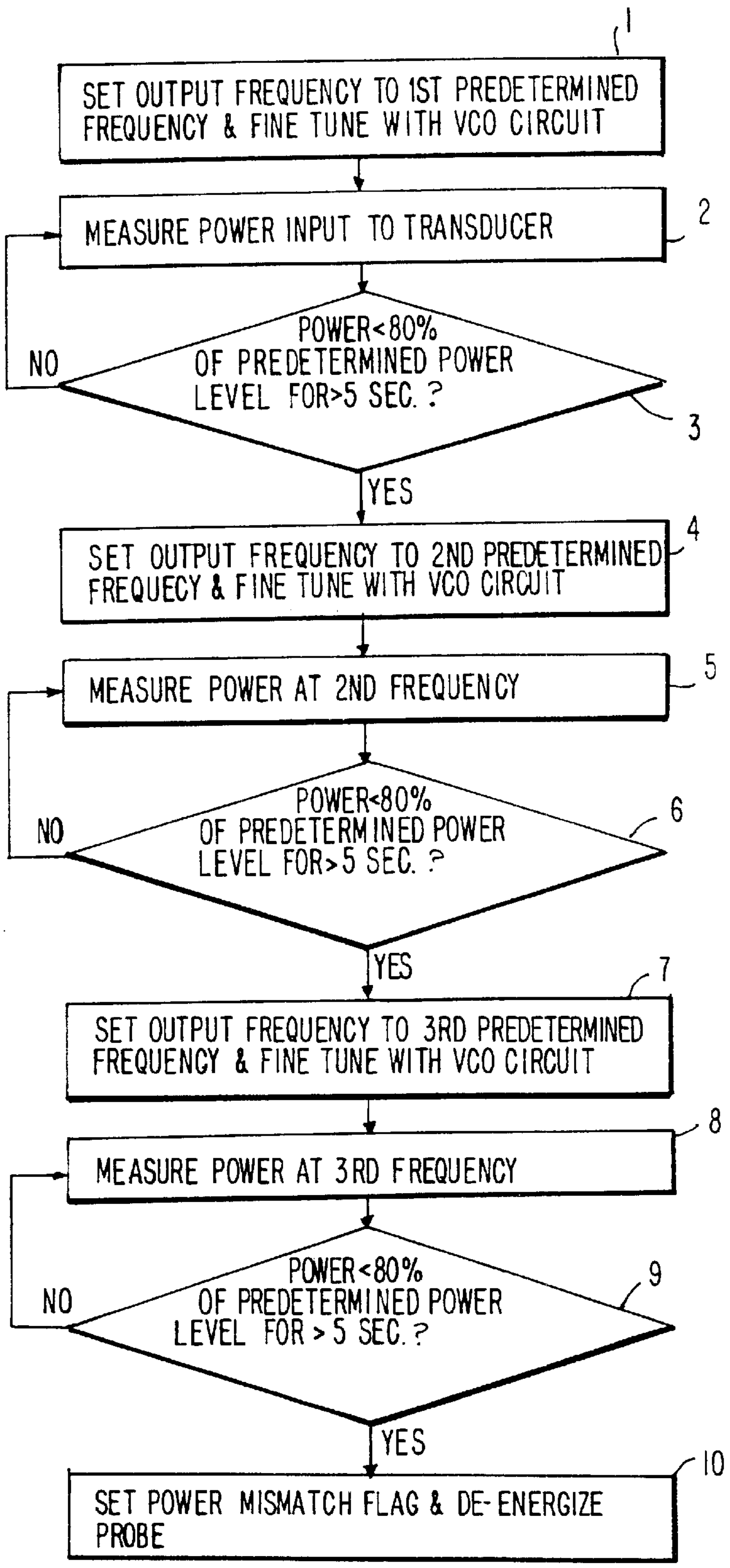
FIG. 6 is a functional block diagram illustrating the procedure utilized in operating and controlling an ultrasonic probe in accordance with an alternative embodiment of the invention.

In order to determine the optimal probe operating frequency in the alternative embodiment, the steps as set forth in FIG. 6 may be followed. First, in Step 1, the frequency output of frequency generator 435 is set to the first center frequency of the first frequency subrange, the probe is energized and a differential amplifier/VCO phase comparator 425 causes the frequency output of frequency generator 435 to sample frequencies in the range of ±150 Hz around the first center frequency. Next, in Step 2, the power input to the transducer is measured. Next, in Step 3, the maximum power input measured in Step 2 is compared to the minimum level necessary to operate the probe safely, which in a preferred embodiment of the invention is approximately 80% of a predetermined power level (18 watts in one embodiment). If the maximum measured power input is greater than 80% of the predetermined value, then the frequency at which this power input level is achieved is used to operate the probe. At this point, the process repeats Step 2 to continuously monitor that the power input to the transducer remains at the minimum operable power level. If however, in Step 3, a sufficient power input level is not initially detected, the systems waits approximately 5 seconds to determine if the power level of the probe will reach the minimum operable power level as a result of impedance changes due to placement of the probe within the vessel. If the minimal operable power level is not detected after 5 seconds, the process proceeds to Step 4 in which the frequency output of frequency generator 435 is set to the second center frequency and the second frequency subrange is tested. As in steps 2 and 3, in Steps 5 and 6 the power input to the transducer is measured and the maximum power input measured is compared to the minimum level required to run the probe. If a suitable frequency at which to operate the probe is not found in the second frequency subrange, the third frequency subrange is selected and tested in Step 7–9. If no suitable frequency is located at which the probe can operate safely in the third frequency subrange, in Step 10 a power mismatch flag is set and the probe is de-energized.

In an alternative embodiment of the invention, this iterative process may be changed slightly. Specifically, rather than increasing and decreasing the frequency from the original frequency, measuring the current at each frequency, and then changing the current in the appropriate direction, it is possible to measure and calculate the slope or phase angle of the frequency/amplitude curve at the current frequency location. Based upon this measurement, it would be determined in which direction the slope increases, and the frequency of the transmission member oscillation could be adjusted accordingly. When the slope of the curve is determined to be flat or zero, the frequency would be producing a maximum current, and therefore amplitude, and would not need to be adjusted.

In an additional embodiment of the invention, it is possible to configure the control system to also monitor for any irregular events in the system, including the fracture or breakage of the transmission wire, or any other event which might effect the effectiveness or safety of the system. Specifically, if the transmission wire were to break, the load of the transmission wire on the transducer will decrease. This will in turn result in an extreme change in resonance frequency as well as an increase in the current supplied to the transducer while maintaining a constant power input to the transducer, and in turn, the control apparatus will attempt to compensate by greatly shifting the oscillation frequency of the transducer. However, when the transducer oscillation frequency or current is no longer within a predetermined range $\nu - \nu\Delta$ and $\nu + \Delta\nu$, the control apparatus determines that there is a problem with the system, and can shut the probe down. In a preferred embodiment, this range includes values from 20 to 100 kHz, more preferable from 30 to 45 kHz and most preferably in the range of 42 kHz±500 Hz. Thus, it is possible to monitor or correct the system for an unexpected, drastic change in the required frequency of oscillation or current in order to shut down the probe is there is a problem.

Additionally, a problem in the transmission wire, such as a fracture, could increase the load on the transducer. This will in turn result in a decrease in the current supplied to the transducer while maintaining a constant power input to the transducer, and in turn, the control apparatus will attempt to compensate by shifting the oscillation frequency of the transducer. However, when the transducer oscillation frequency is no longer within the predetermined range, (preferably 42 kHz±500 Hz) the control apparatus will determine that there is a problem with the system, and can shut the probe down. Thus, it is also possible to monitor the system for an unexpected, drastic change in the required frequency of oscillation as a result of an increase in resistance, which would also result in a decrease in current supplied to the transducer in order to shut down the probe when there is a problem.

Figure 4:
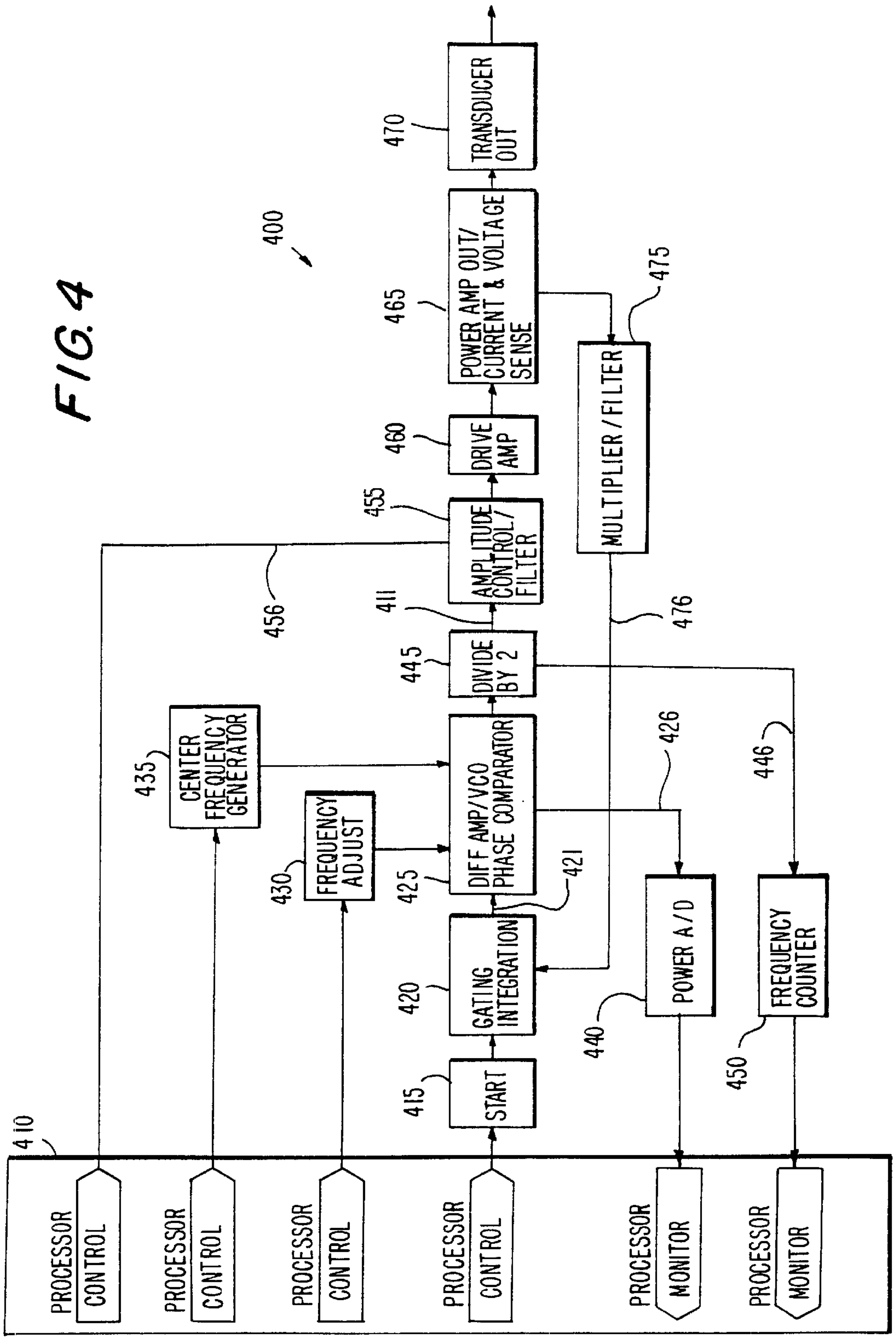
FIG. 4 is a block diagram depicting the functioning of a control system constructed in accordance with an embodiment of the invention.
Figures 1, 5A:
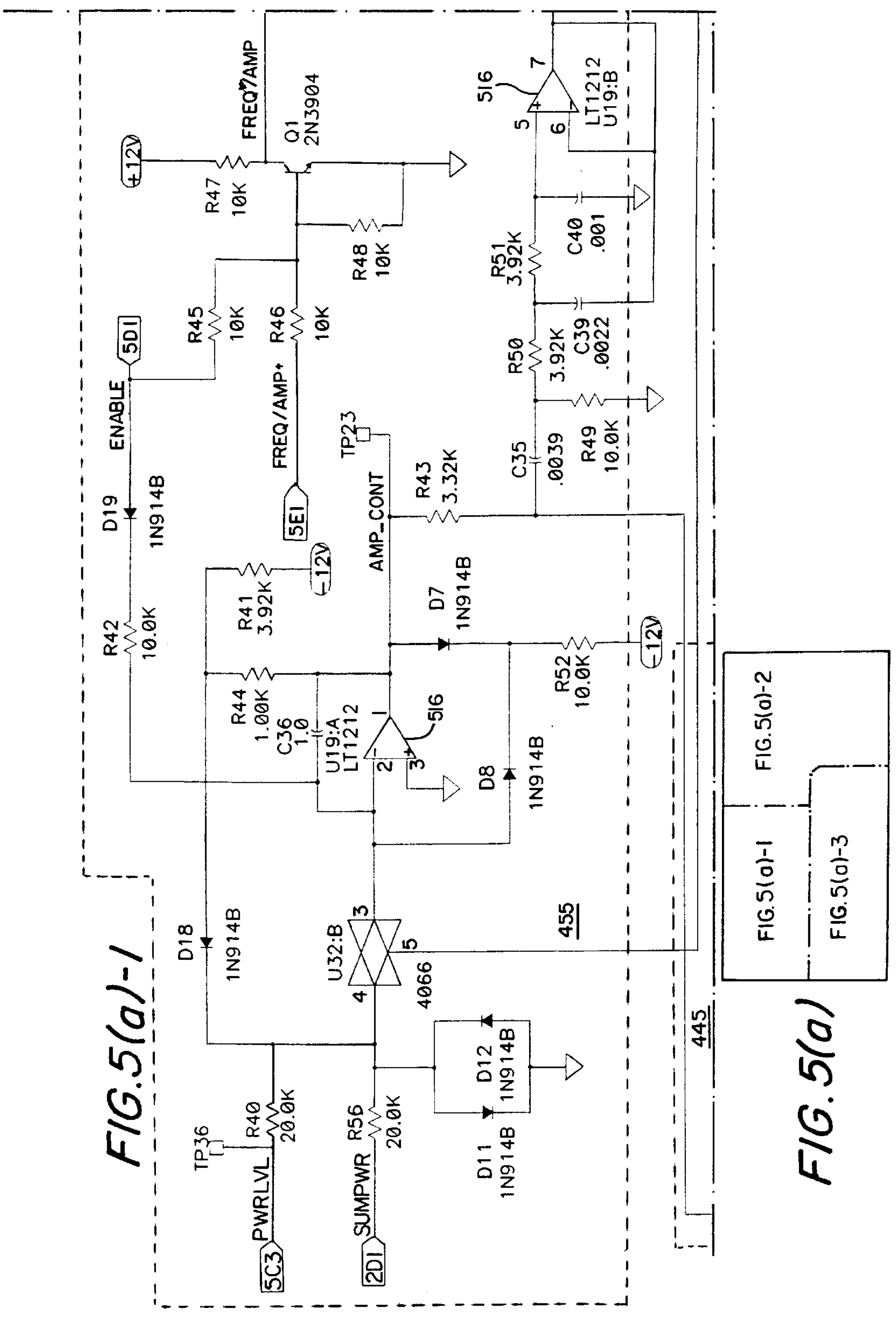
Figures 2, 5A:
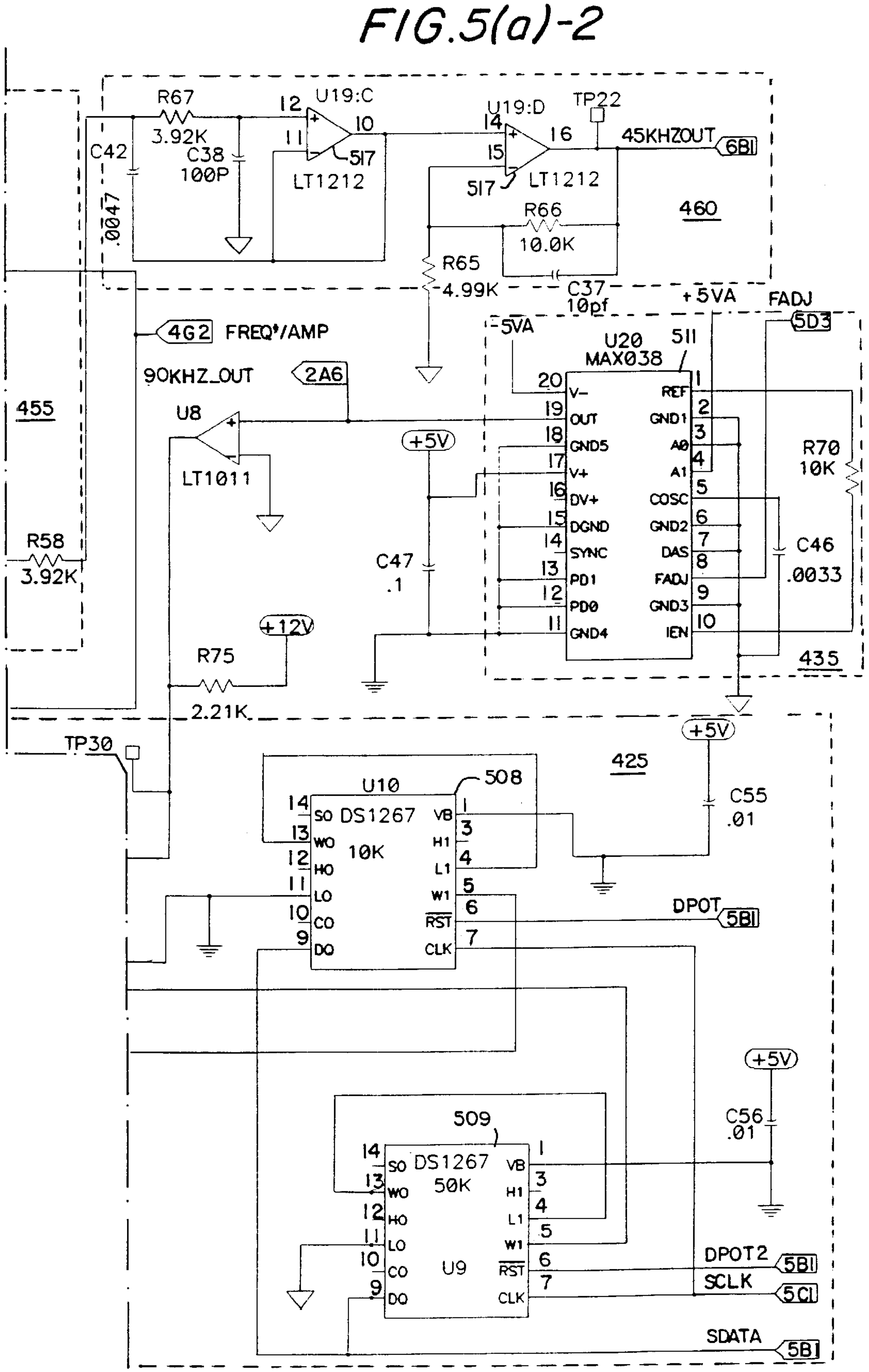
Figures 3, 5A:
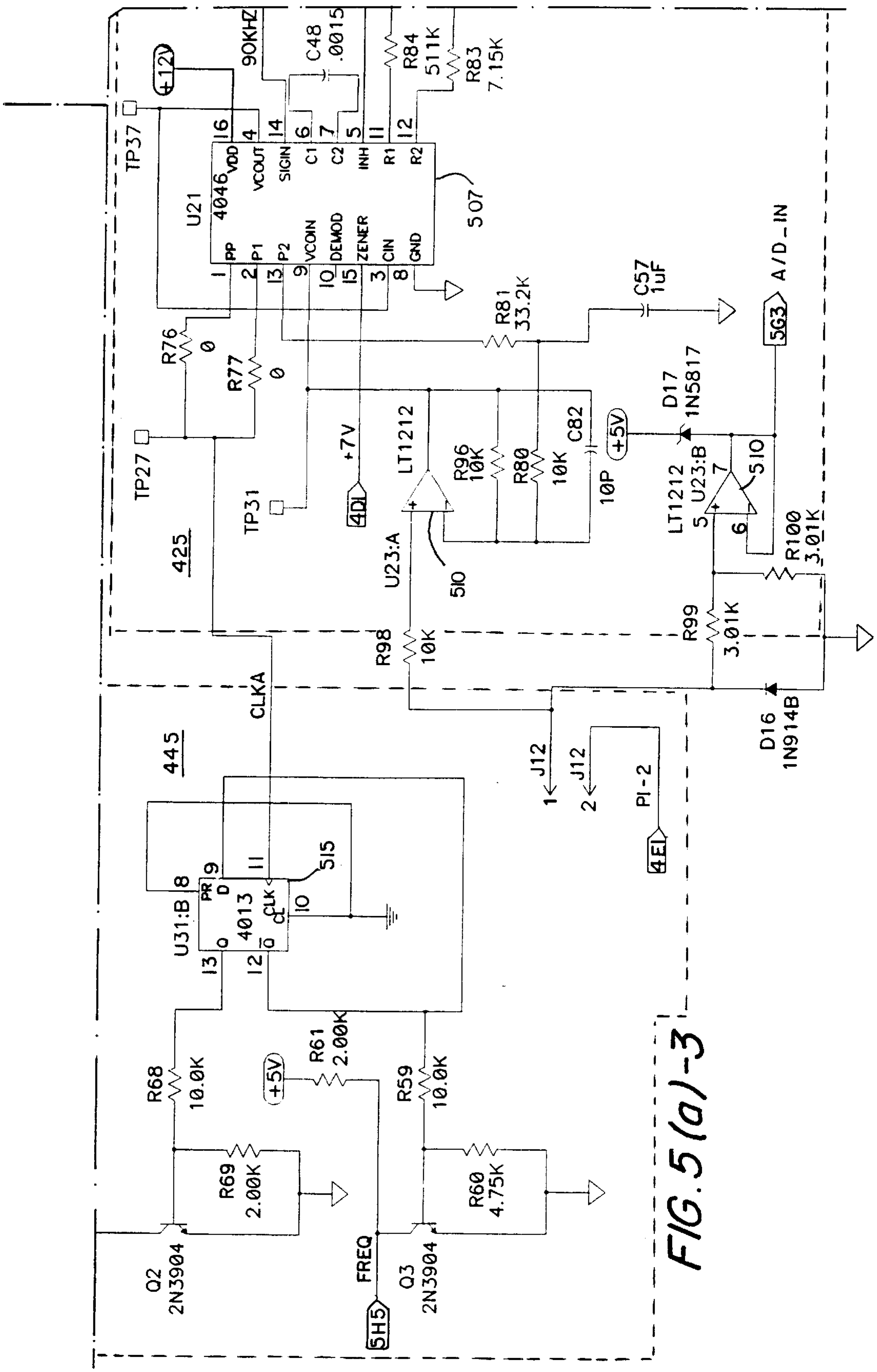
Figures 1, 5B:
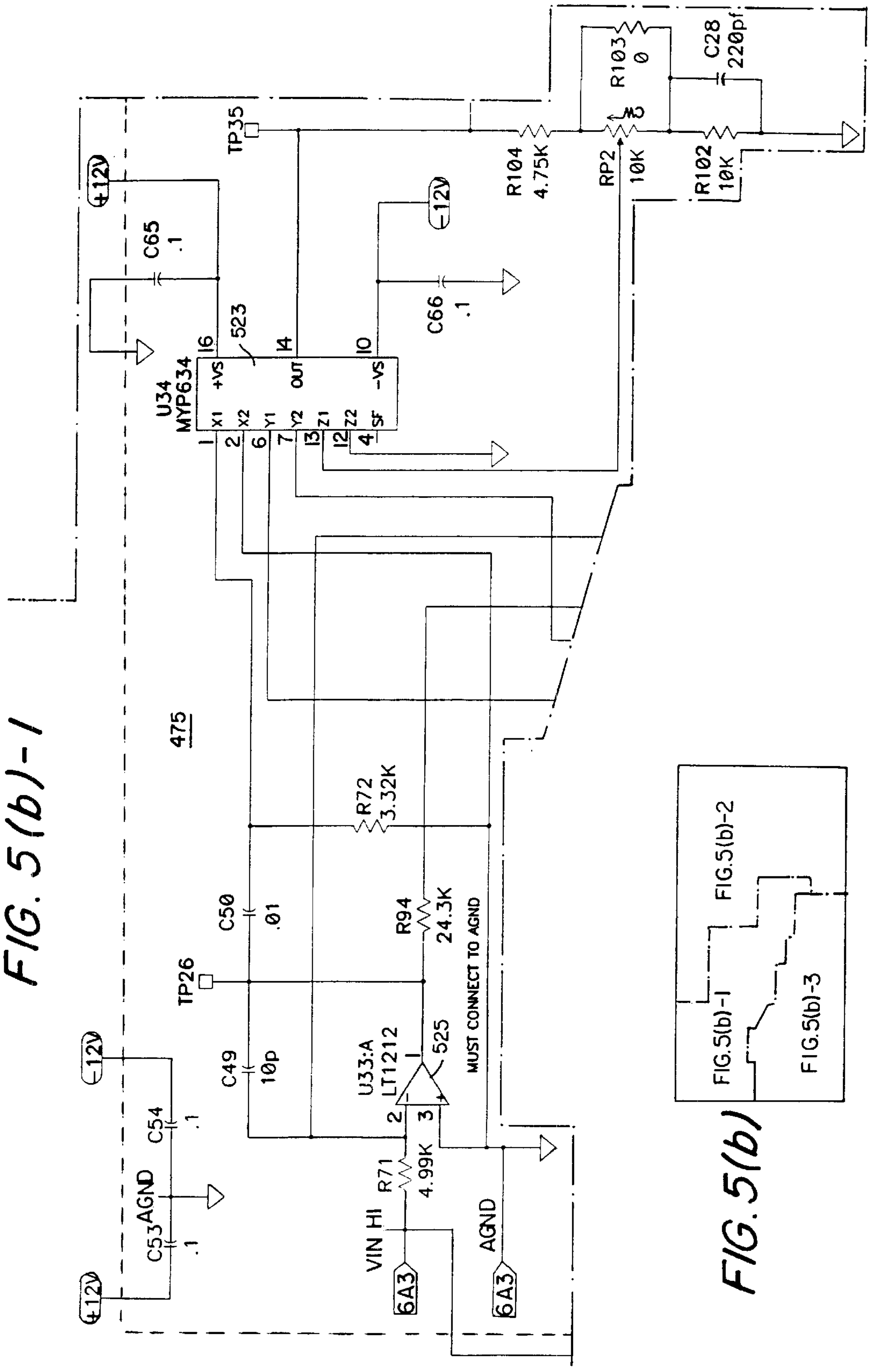
Figures 2, 5B:
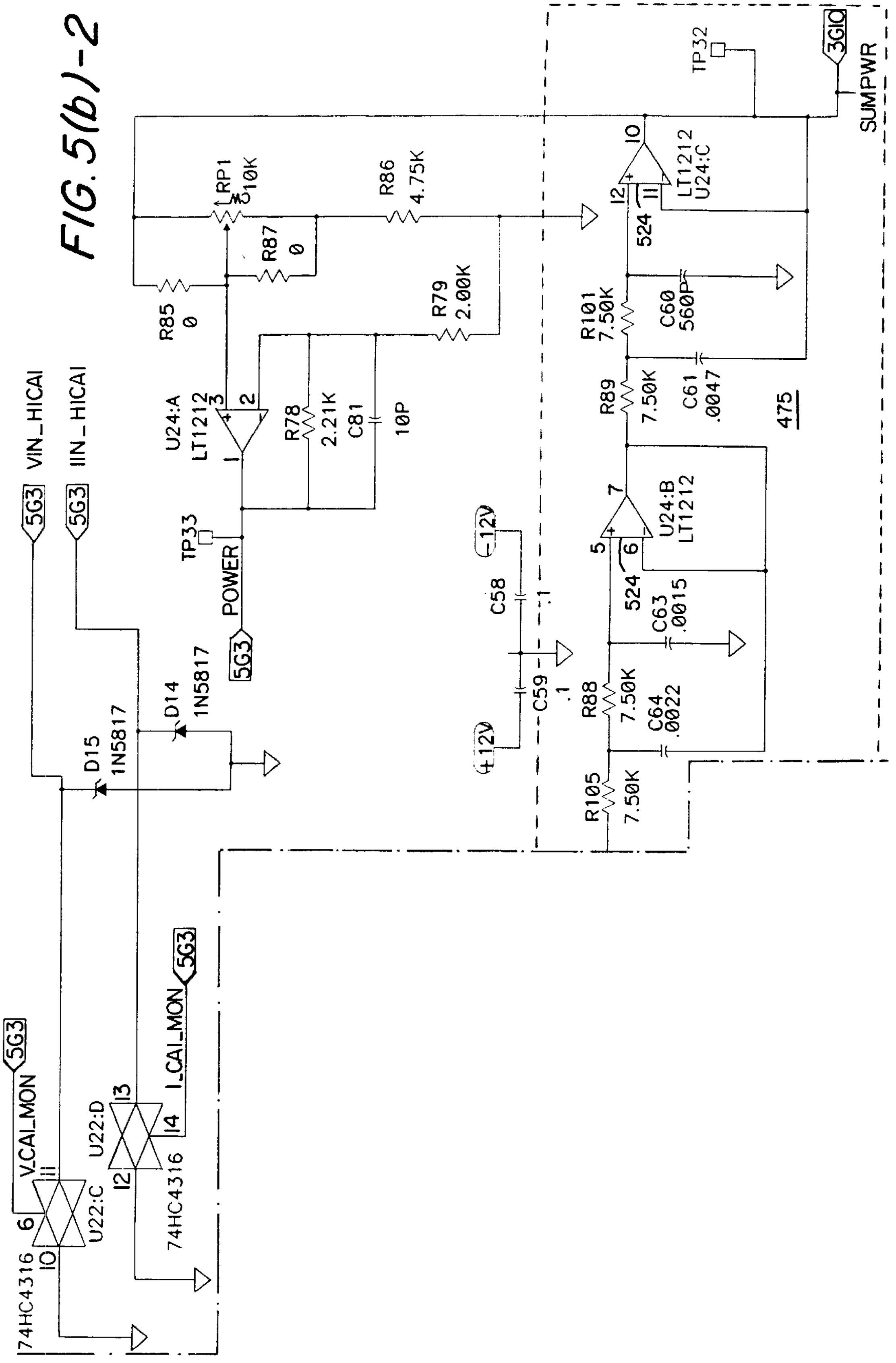
Figures 3, 5B:
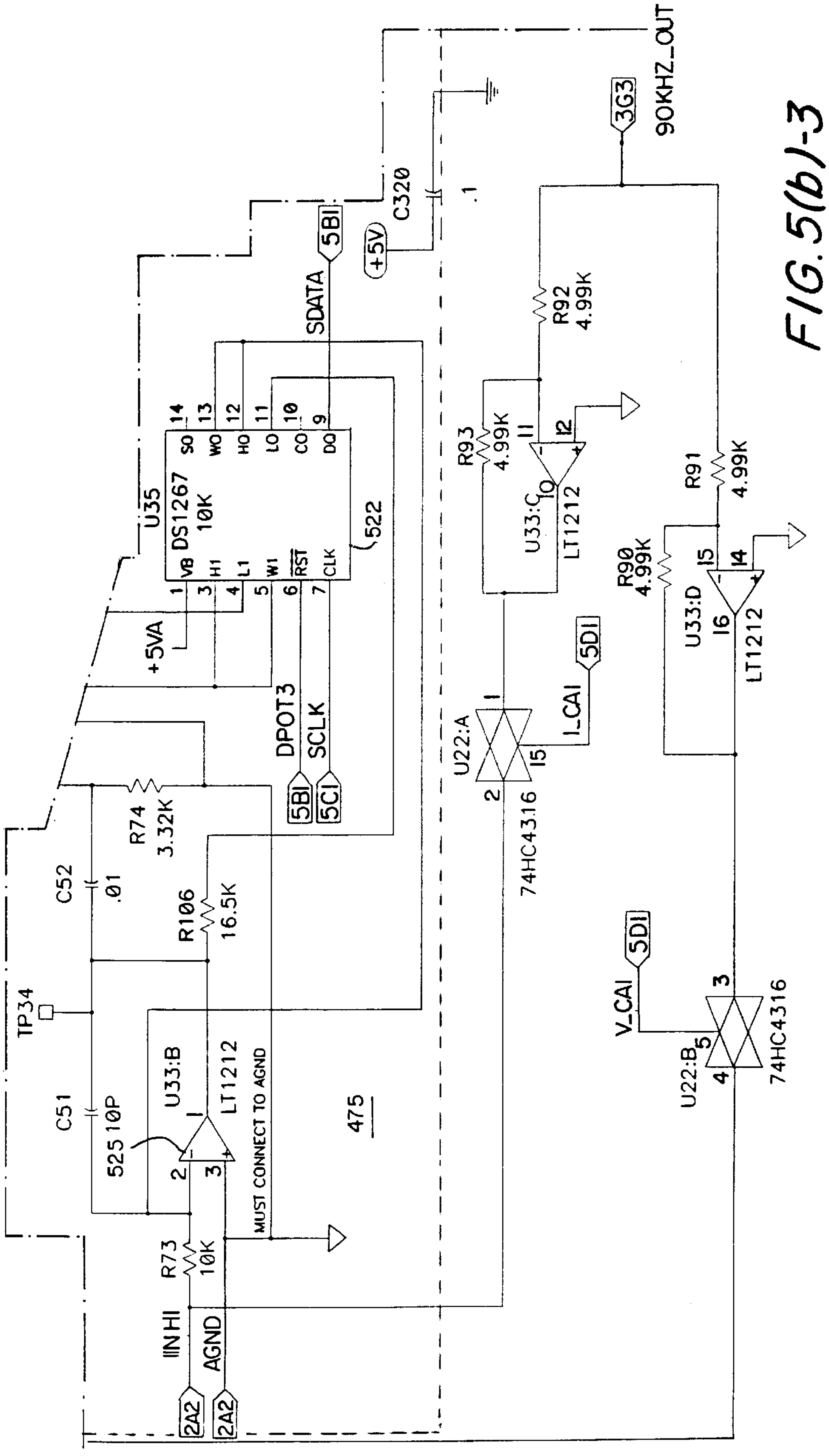
Figures 1, 5C:
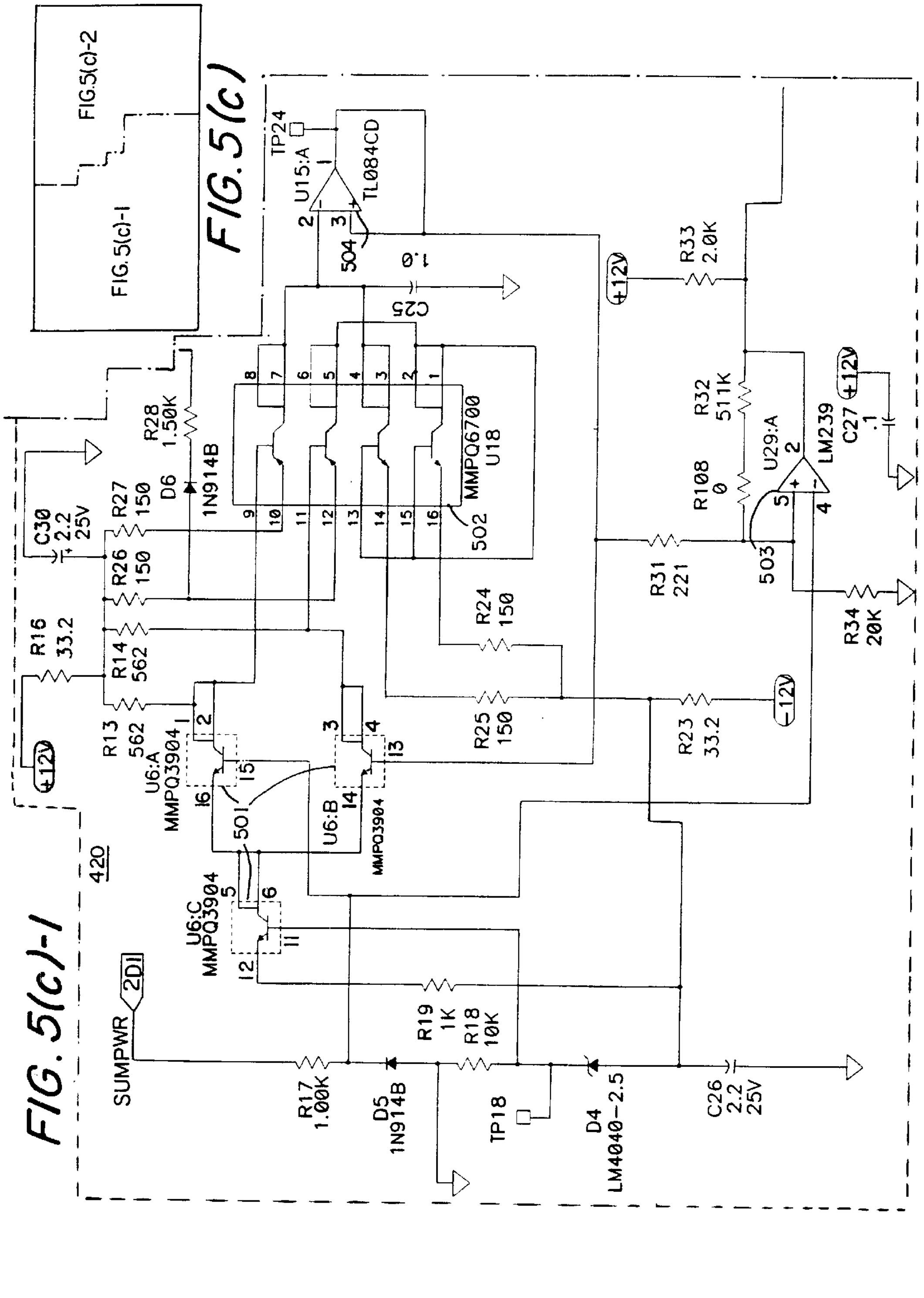
Figures 2, 5C:
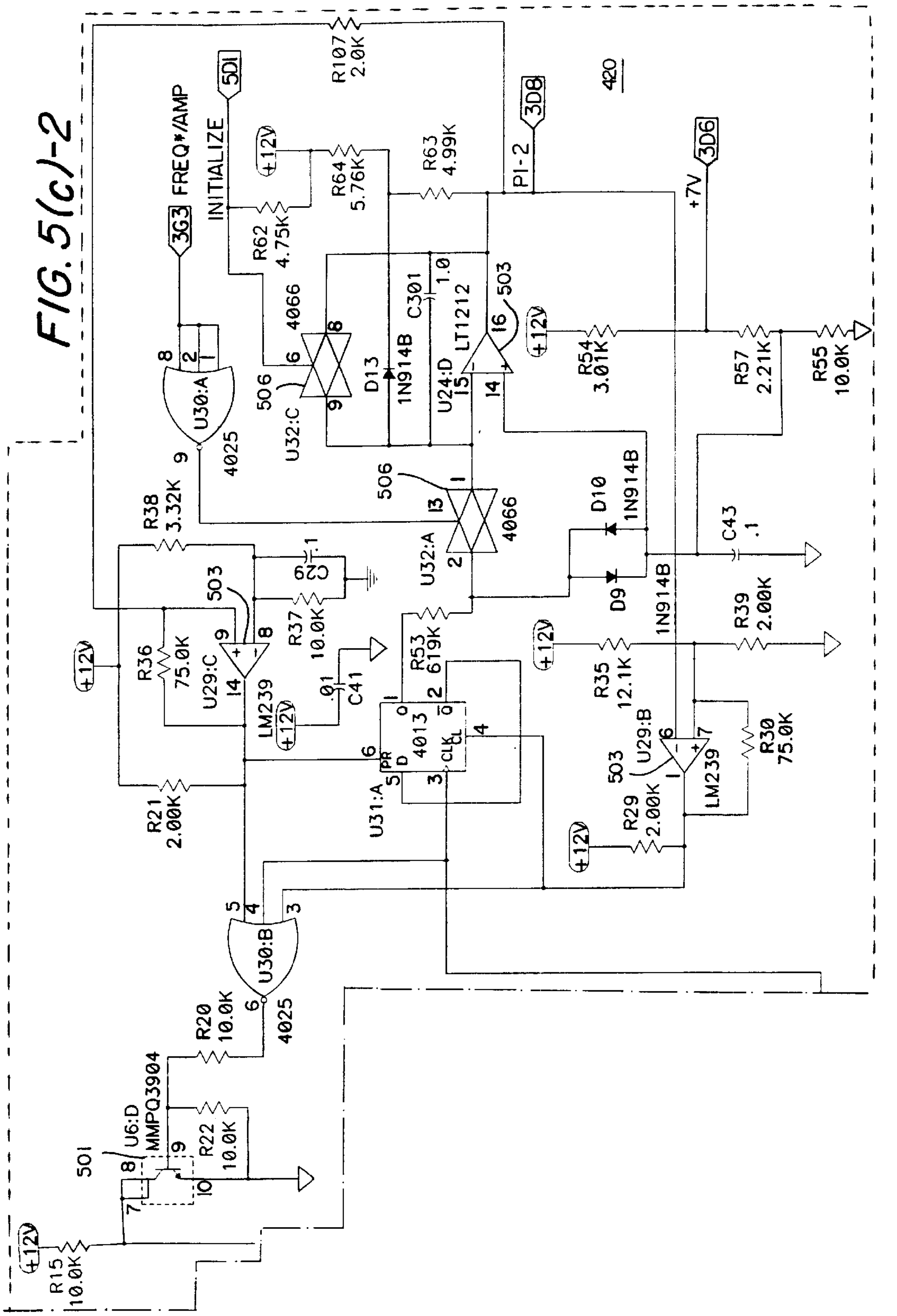
Figures 1, 5D:
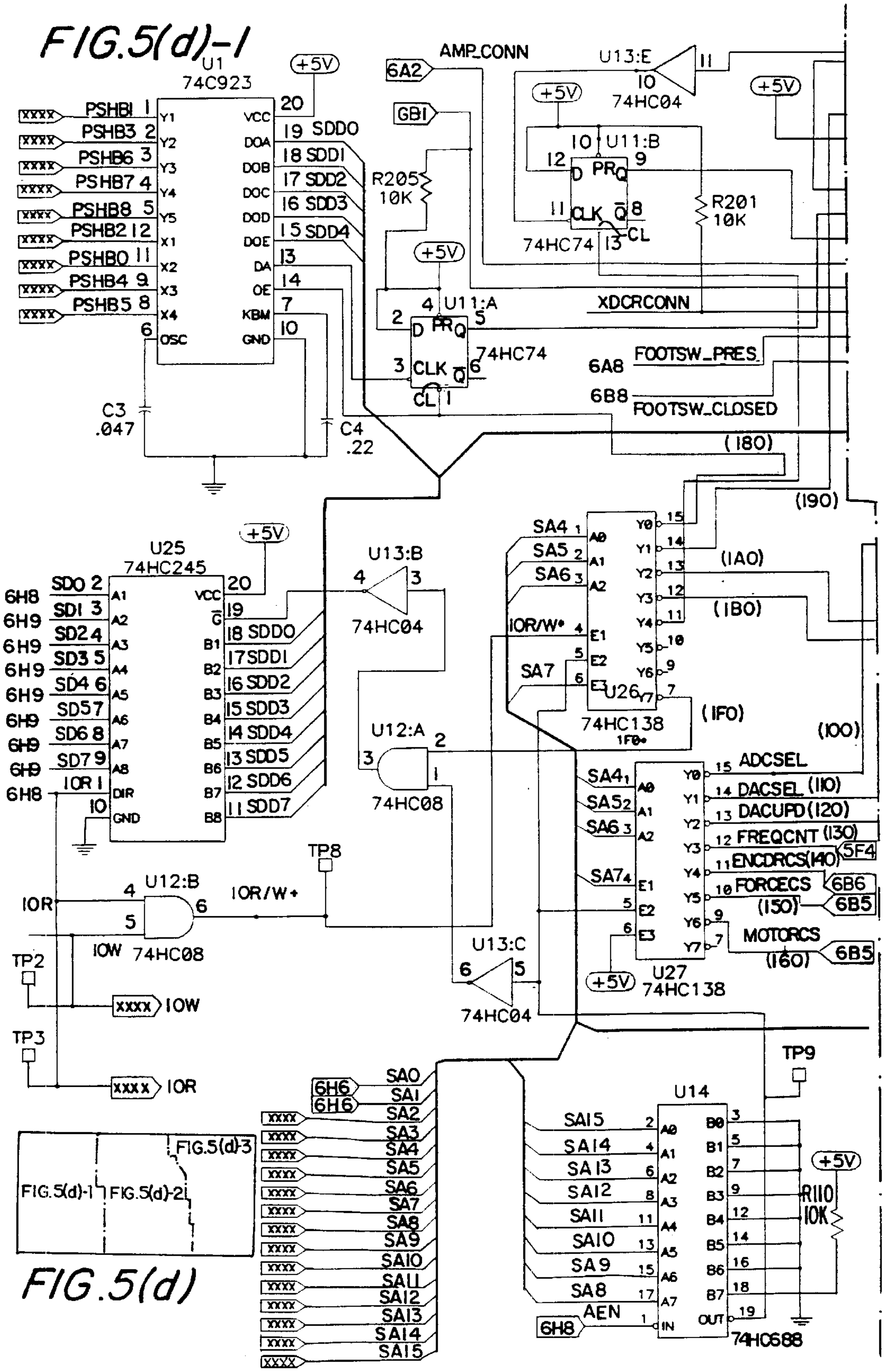
Figures 2, 5D:
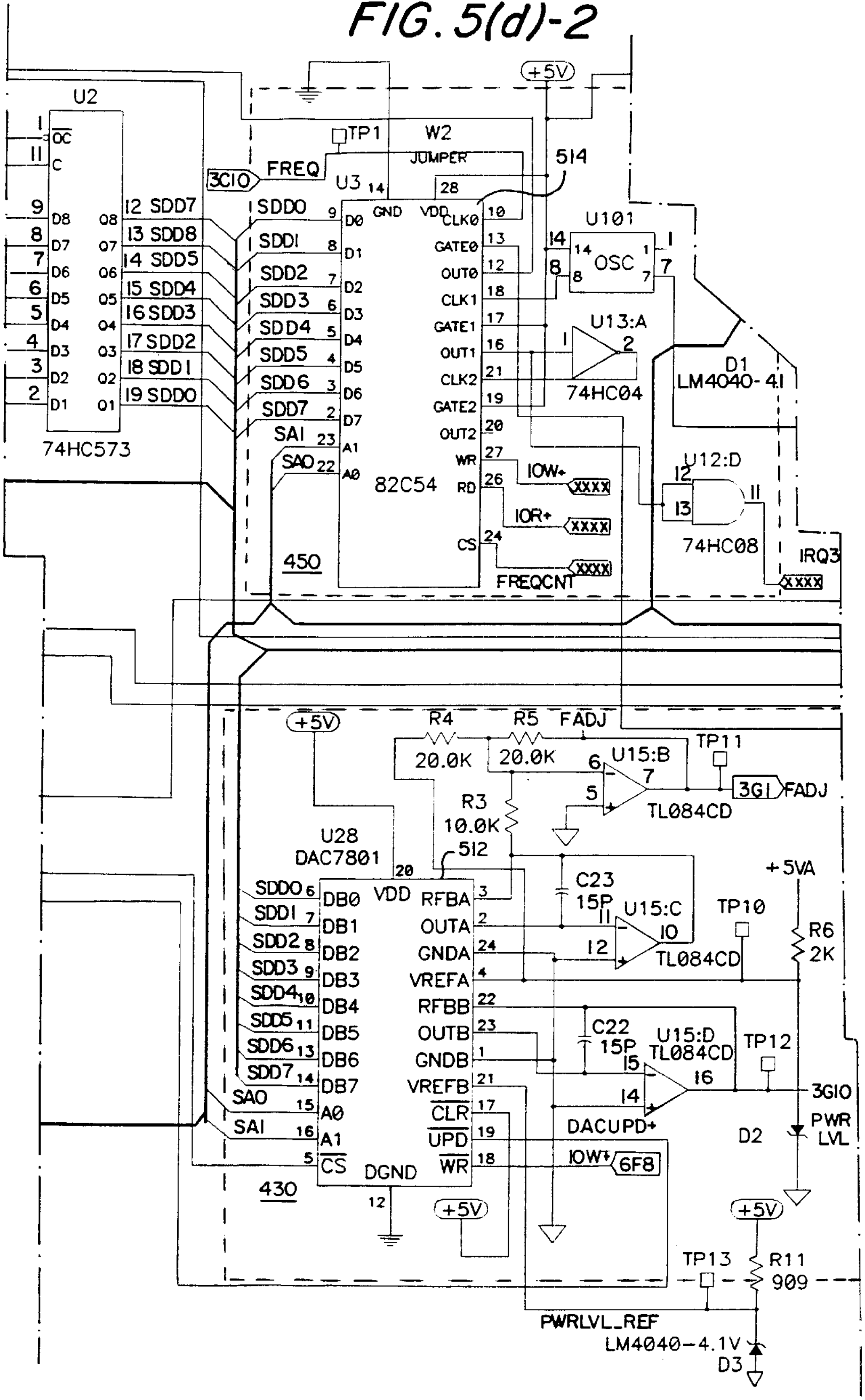
Figures 3, 5D:
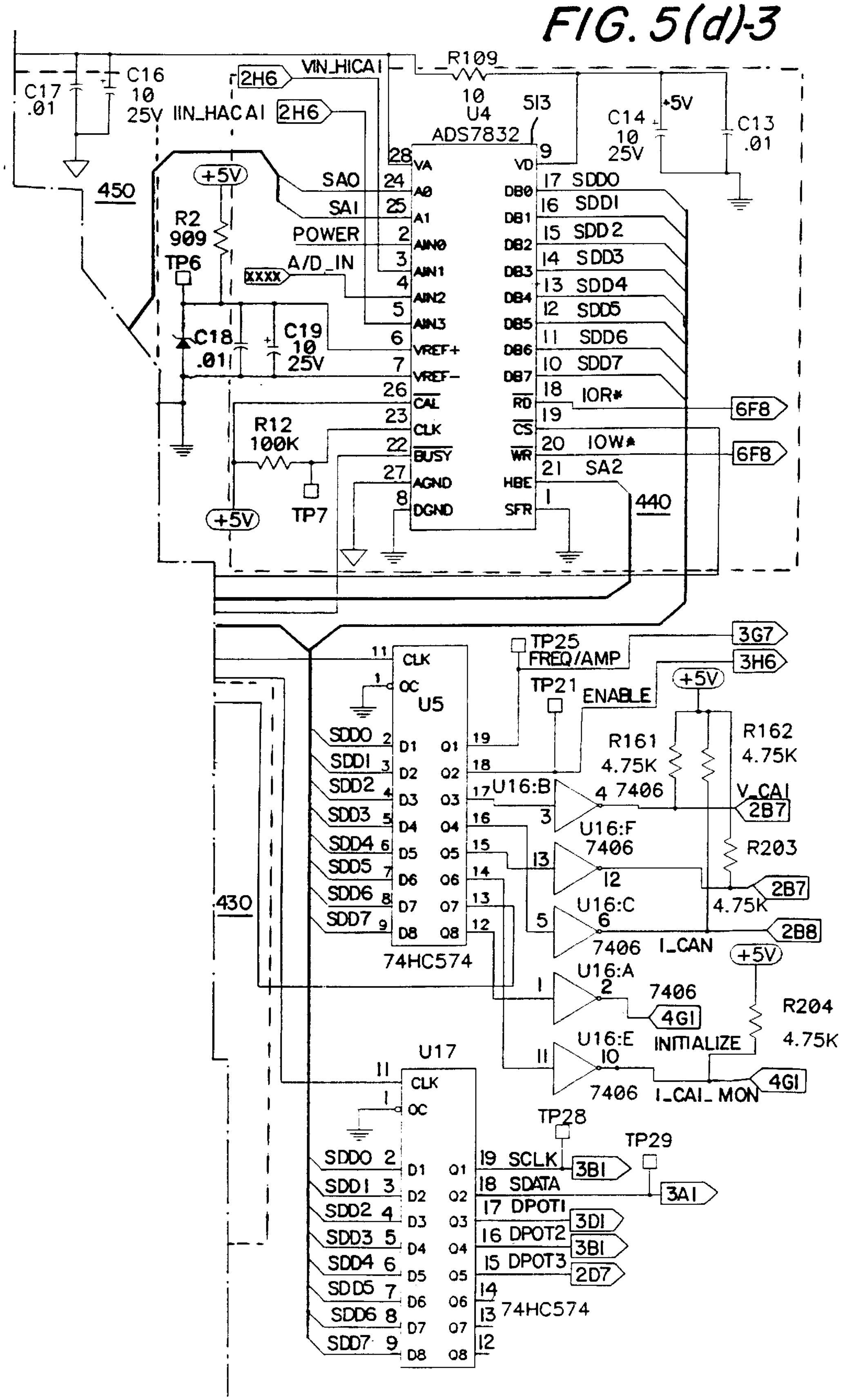
Figures 2, 5E:
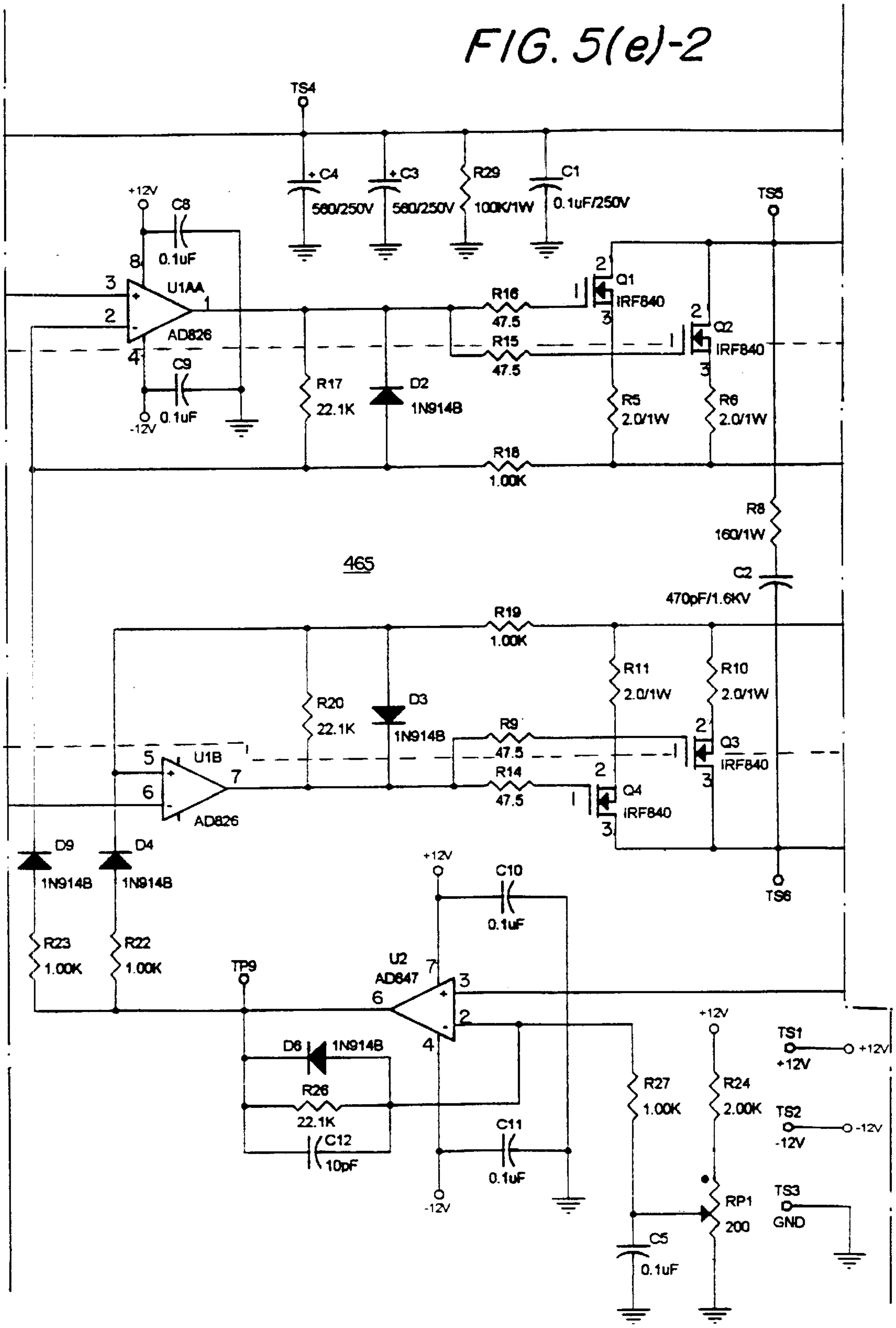
Figures 3, 5E:
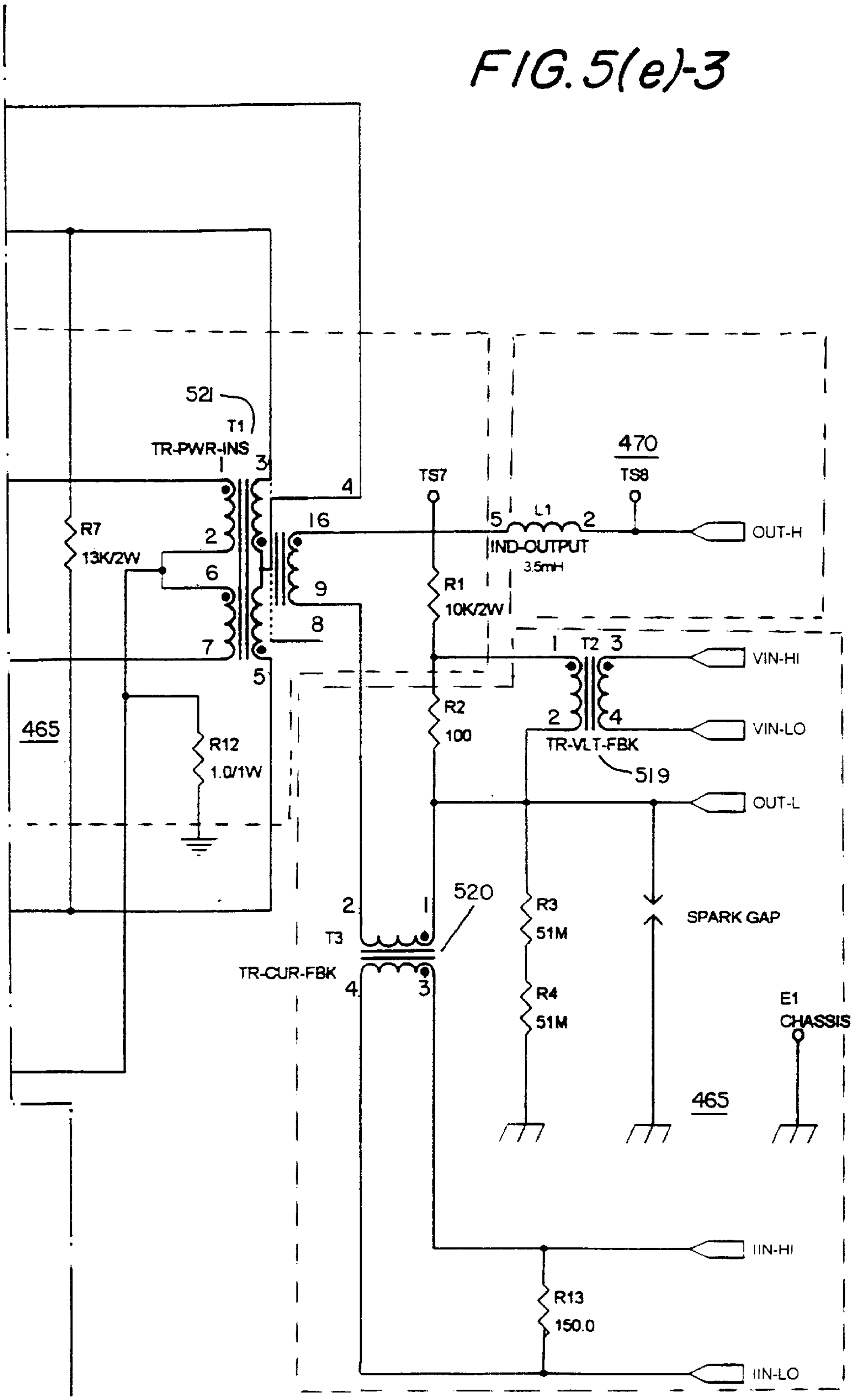

FIG. 4 is a block diagram depicting the functioning of a control system constructed in accordance with one embodiment of the invention. A block diagram of an apparatus for monitoring the amplitude, and therefore the ultrasonic energy output by an ultrasound probe, is indicated generally as control system 400. Control system 400 comprises a processor control apparatus 410 for controlling the interaction of each of the operations performed by system 400. A start element 415 receives a signal from controller 410 and begins the process. A Gating/Integrator 420 receives a standard voltage input, ramping at low frequency, and thereby generates a voltage from 0V to a predetermined limit. In a preferred embodiment, this predetermined limit is 10V. A feedback error signal 476 indicative of the power at the tip of the probe is also received at integrator 420, as will be discussed below. Power is supplied in a preferred embodiment by a 165 volt DC source.

Signal 421 from integrator 420 is fed into Differential Amplifier of a Differential/VCO Phase Comparator 425. This differential amplifier receives input from integrator 420 and feedback error signal 476 and generates a differential signal which has a compensated value to maintain an accurate frequency signal. This differential signal is then fed to a VCO Phase Comparator, also depicted within block 425, which compares the frequency of the output signal to the frequency of a reference signal. This reference signal is generated by a first component signal from center frequency generator 435, which defines a predetermined, center frequency of oscillation, and a second component signal from a frequency adjuster 430, which is a correction based upon the current state of the system, and whether it is necessary to increase or decrease the output frequency. Frequency generator 435 and frequency adjustor 430 comprise a variable frequency generator, in a preferred embodiment. This calculated frequency signal 426 is then forwarded to Power A/D 440, which is monitored by controller 410 to maintain the system at the optimum frequency, and frequency divider 445, where this frequency is divided by two to yield the adjusted output frequency. The frequency had previously been maintained at double the required frequency, to maintain a higher degree of resolution during measurement and calculation. This divided frequency signal 446 is also forwarded to a Frequency Counter 450, which allows controller 410 to monitor the frequency signal which will be output from the system.

The adjusted output frequency signal 411, which is set to the required frequency, is first passed through an Amplitude Control/Filter 455, which level shifts and references the signal to the predetermined set power levels. The signal is AC coupled by gating signal 456 and filtered to provide a bipolar signal at the system operation frequency. This bipolar signal inputs into a Drive Amplifier 460. Drive Amplifier 460 amplifies the bipolar signal from Amplitude Control/Filter 455. In a preferred embodiment, the filtered bipolar signal is amplified with a gain of 2. Then, this output is forwarded to an amplifier, a Power Amplifier Out and Current and Voltage Sensors PAO/CVS 465. Power Amp Out 465 further amplifies the filtered bipolar signal to be transmitted to a Transducer Out 470, which will be converted to mechanical energy in the form of a mechanical displacement. This transducer may be a piezoelectric transducer, in a preferred embodiment. This power output signal is always maintained at a constant predefined power during operation, regardless of the frequency or other factors. In one preferred embodiment, the predetermined power is 18 watts.

At the same time, the voltage and current input to the transducer are monitored at PAO/CVS 465, and the impedance is determined based upon the state of the probe. The measured values of current and voltage are fed to a Multiplier/Filter 475, which processes the signal indicative of the measured values to determine the true power output at the transducer, which is also a function of the amplitude of the oscillating tip of the probe. The current and voltage sensors may both be implemented as transformers. This power determination signal 476 is then fed back into the gating integrator 420 where it is processed, and the feedback control loop is completed. This power determination is then utilized to determine whether the oscillation frequency of the probe tip should be altered. The system utilizes the method as set forth in FIG. 3 for this determination.

Reference is next made to FIGS. 5(*a*)–5(*d*), which depict specific structure of a preferred embodiment of the invention which may be employed to implement the invention as shown in FIG. 4. It is to be understood that any additional components not specifically mentioned are also included in the preferred embodiment, as are depicted in the figures. Any reference to any specific components is similarly intended to be for example only, and is in no way intended to limit the structures which may be used herein.

Controller 410 is a computer controller, and may utilize any computer with sufficient controller software instructions to control the functioning of the feedback control apparatus. Gating/Integrator 420 performs a gating and integration function, and is depicted in FIG. 5(*c*). Gating/Integrator 420 includes an NPN transistor package 501, and NPN/PNP transistor package 502, a QUAD comparator 503, an operational amplifier 504 acting as a buffer, an operational amplifier 505 acting as an integrator, and an analog switch 506. These components are wired as shown in FIG. 5(*c*). In a further preferred embodiment, a particular chip which may be employed as NPN transistor package 501 is sold by Motorola under the designation MMPQ3904. A particular chip which may be employed as NPN/PNP transistor package 502 is sold by Motorola under the designation MMPQ6700. A particular chip which may be employed as QUAD comparator 503 is sold by Motorola under the designation LM239. A particular chip which may be employed as operational amplifiers 504 and 505 is sold by Linear Technology under the designation LT1212. Analog switch 506 is sold by Motorola under the designation HC4066.

Differential Amplifier/VCO Phase Comparator 425 performs the calculation of the actual frequency, compares this to the desired frequency and produces a differential signal, which allows for the adjustment of the output frequency, and is depicted in FIG. 5(*a*). Differential Amplifier/VCO Phase Comparator 425 includes a phase locked loop 507, a 10K Digital POT 508 calculating the frequency offset from the desired frequency, a 50K Digital POT 509 controlling the frequency range about the desired frequency, and an operational amplifier 510 acting as a differential amplifier. These components are wired as shown. A particular chip which may be employed as Phase Locked Loop 507 is sold by Harris under the designation CD4046B. A particular chip which may be employed as 10K Digital POT 508 and 50K Digital POT 509 are sold by Dallas Semiconductor under the designation DS1267-10 and DS1267-50 respectively. A particular chip which may be employed as operational amplifier 510 is sold by Motorola under the designation LT1212. Also shown in FIG. 5(*a*) is Center Frequency Generator 435, which includes a high frequency waveform generator 511, which generates a waveform at a predetermined desired frequency. A particular chip which may be employed as high frequency waveform generator 511 is manufactured by Maxim under the designation MAX038.

Frequency Adjuster 430 is shown in FIG. 5(*d*) and includes a frequency controller 512 which controls and adjusts the center frequency, wired as shown. A particular chip which may be employed as frequency controller 512 is sold by Burr-Brown under the designation DAC7801. FIG. 5(*d*) also depicts Power Analog to Digital converter 440, which includes a digital to analog converter 513 and which interfaces with controller 410 for monitoring power, and Frequency Counter 450, which includes a timer/counter 514 and which interfaces with controller 410 to monitor output frequency, wired as shown. A particular chip which may be employed as digital to analog converter 513 is sold by Burr-Brown under the designation ADC7802. A particular chip which may be employed as timer/counter 514 is sold by Intel under the designation 82C54.

As is further connected as shown in FIG. 5(*a*), divide by 2 means 445 includes a frequency divider 515, Amplitude Control Filter 455 includes an Operational Amplifier 516 acting as a control filter, and Drive Amplifier 460 includes an operational amplifier 517 acting as a drive amplifier. A particular chip which may be employed as frequency divider 515 is sold by National Semiconductor under the designation CD4013. A particular chip which may be employed as operational amplifier 516 or operational amplifier 517 is sold by Linear Technology under the designation LT1212.

Power Amp Out/Current and Voltage sensors 465 include a drive transformer 518, a voltage feedback transformer 519 and a current feedback transformer 520, as shown and connected in FIG. 5(*e*). FIG. 5(*e*) also depicts Transducer 470, which includes a power transformer 521, connected as shown.

Finally, Multiplier/Filter 475 is depicted and connected as shown in FIG. 5(*b*), and includes a 10K Digital POT 522, which sets the current and voltage gain, an Analog Multiplier 523, which calculates the power, an Operational Amplifier 524, which acts as a filter and an operational amplifier 525, which act as a current and voltage buffer. A particular chip which may be employed as 10K Digital POT 522 is sold by Dallas Semiconductor under the designation DS1267-10. A particular chip which may be employed as Analog Multiplier 523 is sold by Burr-Brown under the designation MPY634. Particular chips which may be employed as Operational Amplifiers 524 and 525 are sold by Linear Technology under the designation LT1212.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for controlling a probe including a transmission member and a transducer for generating mechanical oscillations and generating a standing wave on the transmission member, comprising:

supplying a constant power to a transducer coupled to a transmission member and generating a standing wave on the transmission member;

varying the frequency of oscillation of the transmission member coupled with said transducer by a first amount above a selected frequency;

varying the frequency of oscillation of the transmission member by a second amount below the selected frequency;

measuring the currents supplied to said transducer while the frequency is varied by the first and second amounts; and adjusting the frequency of oscillation according to the currents measured while the frequency is varied by the first and second amounts.

2. A control system for a probe coupled to a transducer constructed to oscillate at a selected frequency and impart oscillation to a transmission member, comprising:

a power source for supplying a constant predetermined electrical power;

a transducer coupled to the power source for converting the electrical power to oscillation at a selected frequency and coupled to a transmission member capable of supporting a standing longitudinal wave;

a frequency adjustment device for measuring the frequency of the mechanical output of the transducer; and varying the frequency a selected amount above and below said selected frequency;

a current monitoring device for measuring current supplied to the transducer which monitors said current while the frequency of said mechanical output is varied; and a processor operable to control the frequency adjustment device and the current monitoring device wherein under the control of the processor, wherein the frequency adjustment device varies the frequency of said mechanical output by a first amount above said selected frequency and by a second amount below said selected frequency and wherein the selected frequency is adjusted according to the currents monitored by the current monitoring device while the frequency adjustment device varies the frequency by the first amount and by the second amount.

3. The control system of claim 2, wherein said transmission member includes a wire or a rod.

4. The apparatus of claim 2, wherein said power generator is a 165 volt DC source.

5. The apparatus of claim 2, wherein said transducer is a piezoelectric transducer.

6. The apparatus of claim 2, wherein said selected frequency is approximately 42 kHz.

7. The apparatus of claim 6, wherein said frequency is varied at most ±500 Hz above and below said selected frequency.

8. The apparatus of claim 2, wherein said frequency adjustment device is a controller of a variable frequency generator.

9. The apparatus of claim 2, wherein said current monitoring device is a transformer.

10. The apparatus of claim 2, wherein said voltage measuring device is a transformer.

11. The apparatus of claim 2, wherein said frequency selector is a variable frequency generator.

12. A control system for a probe coupled to a transducer constructed to oscillate at a selected frequency and impart the oscillation to a transmission member, the control system comprising:

a power source that supplies an electrical power;

a transducer coupled to the power source to convert the electrical power to oscillations at a selected frequency and coupled to a transmission member capable of supporting a standing longitudinal wave;

a frequency adjuster operable to vary the transducer output frequency;

a current monitor that measures current supplied to the transducer while the frequency of the transducer output is varied by the frequency adjuster; and a processor coupled to and operable to control both the frequency adjuster and the current monitor, wherein under the control of the processor, wherein the frequency adjuster varies the frequency of the transducer output by a first amount in a first direction and by a second amount in a second direction opposite to the first direction while the current monitor measures the currents supplied to the transducer and wherein the selected frequency of the transducer output is adjusted according to the currents measured by the current monitor.

13. The control system according to claim 12, wherein under the control of the processor, the frequency variation by the frequency adjuster in the first and second directions and adjustment of the selected frequency are repeated continuously to optimize the oscillation amplitude.

14. The control system according to claim 12, wherein under the control of the processor, the frequency variation by the frequency adjuster in the first and second directions and adjustment of the selected frequency are repeated continuously to optimize the oscillation amplitude and the first and second amounts are each at most 500 Hz.

15. The control system according to claim 12, wherein the transmission member includes a wire or rod operable to oscillate by the transducer and coupled to the transducer for insertion into a human body.

* * * * *